(12) United States Patent
Liu et al.

(10) Patent No.: US 11,467,669 B2
(45) Date of Patent: Oct. 11, 2022

(54) OPERATIONAL FEEDBACK USING CAPACITIVE SENSING

(71) Applicant: META PLATFORMS TECHNOLOGIES, LLC, Menlo Park, CA (US)

(72) Inventors: Tianshu Liu, Redmond, WA (US); Jonathan Robert Peterson, Woodinville, WA (US); Kenneth Alexander Diest, Kirkland, WA (US); Renate Eva Klementine Landig, Seattle, WA (US); Daniele Piazza, Redmond, WA (US); Yigit Menguc, Redmond, WA (US); Harsha Prahlad, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/139,181

(22) Filed: Dec. 31, 2020

(65) Prior Publication Data
US 2022/0113800 A1    Apr. 14, 2022

Related U.S. Application Data

(60) Provisional application No. 63/089,034, filed on Oct. 8, 2020.

(51) Int. Cl.
*G06F 3/01* (2006.01)
*G06F 3/044* (2006.01)

(52) U.S. Cl.
CPC .............. *G06F 3/016* (2013.01); *G06F 3/014* (2013.01); *G06F 3/044* (2013.01)

(58) Field of Classification Search
CPC ....... F15B 21/065; B25J 9/1075; G06F 3/016; G06F 3/041
See application file for complete search history.

(56) References Cited

U.S. PATENT DOCUMENTS

| 5,284,179 A | 2/1994 | Shikida et al. |
| 7,474,180 B2 | 1/2009 | Bintoro et al. |

(Continued)

FOREIGN PATENT DOCUMENTS

| WO | 2019166635 A1 | 9/2019 |
| WO | 2020190732 A1 | 9/2020 |
| WO | 2021188221 A1 | 9/2021 |

OTHER PUBLICATIONS

Bar-Cohen Y., "Electroactive Polymers as Artificial Muscles—Capabilities, Potentials, and Challenges," Handbook on Biomimetics, Osada (editor), 2000, Chapter 8, 20 Pages.

(Continued)

*Primary Examiner* — William Lu
(74) *Attorney, Agent, or Firm* — FisherBroyles, LLP

(57) ABSTRACT

Disclosed devices may include a membrane, a first electrode supported by the membrane, a second electrode, a capacitance sensor configured to determine a capacitance measurement between the first electrode and the second electrode, and a controller configured to control an electrical potential applied between the electrode and the second electrode. The controller may be configured to modify the electrical potential based on the capacitance measurement. Example devices may include one or more flexible membranes that may, at least in part, define an enclosure that is at least partially filled with a dielectric fluid. Examples also include associated methods and systems.

19 Claims, 18 Drawing Sheets

(56) References Cited

U.S. PATENT DOCUMENTS

| | | | |
|---|---|---|---|
| 2003/0180965 | A1 | 9/2003 | Yobas et al. |
| 2011/0227872 | A1 | 9/2011 | Huska et al. |
| 2012/0228991 | A1* | 9/2012 | Vranish .................. B25J 9/1075 310/300 |
| 2013/0068622 | A1* | 3/2013 | Schertzer ............... G01N 27/07 204/600 |
| 2013/0186699 | A1* | 7/2013 | Prahlad .................. H02N 13/00 901/1 |
| 2014/0160063 | A1* | 6/2014 | Yairi ................... G06F 3/04886 345/173 |
| 2014/0238153 | A1* | 8/2014 | Wood .................... A43B 23/029 73/862.627 |
| 2015/0019013 | A1* | 1/2015 | Rose ...................... B25J 9/1612 702/41 |
| 2015/0250420 | A1* | 9/2015 | Longinotti-Buitoni .................... A61B 5/1135 600/534 |
| 2016/0025669 | A1* | 1/2016 | Sun ...................... G01N 27/305 204/418 |
| 2016/0363997 | A1* | 12/2016 | Black ...................... G06F 3/014 |
| 2017/0112671 | A1 | 4/2017 | Goldstein |
| 2017/0131770 | A1* | 5/2017 | Keller ..................... G06F 3/011 |
| 2017/0168576 | A1* | 6/2017 | Keller ..................... G06F 3/014 |
| 2019/0265114 | A1* | 8/2019 | Lai ....................... G01P 15/0802 |
| 2020/0032822 | A1* | 1/2020 | Keplinger ............... F15B 15/08 |
| 2020/0174336 | A1* | 6/2020 | Chuma ................. G02F 1/1685 |
| 2020/0186056 | A1* | 6/2020 | Menguc ................. G06F 3/016 |
| 2021/0284525 | A1 | 9/2021 | Liu et al. |

OTHER PUBLICATIONS

Boys H., et al., "Soft Wearable Non-Vibratory Tactile Displays," IEEE International Conference of Soft Robotics (RoboSoft), Apr. 24-28, 2018, pp. 270-275.

Chang M.P., et al., "Electrostatically-Driven Elastomer Components for User-Reconfigurable High Density Microfluidics," Lab Chip, 2009, vol. 9, pp. 1274-1281.

Duranti M., et al., "A New Class of Variable Capacitance Generators Based on the Dielectric Fluid Transducer," Smart Mater. Struct., 2017, vol. 26, p. 115014, 17 Pages.

Gebbers P., et al., "Zipping it up: DEAs Independent of the Elastomer's Electric Breakdown Field," Proc. SPIE, Electroactive Polymer Actuators and Devices (EAPAD), 2012, vol. 8340, 83402P, 15 Pages.

Johnson K.B., et al., "Identification and Control of a Nonlinear Soft Actuator and Sensor System," IEEE Robotics and Automation Letters, vol. 5, No. 3, Jul. 2020, pp. 3783-3790.

Kellaris N., et al., "An Analytical Model for the Design of Peano-HASEL Actuators with Drastically Improved Performance," Extreme Mechanics Letters, 2019, vol. 29, 100449, 10 Pages.

Kellaris N., et al., "Peano-HASEL Actuators: Muscle-Mimetic, Electrohydraulic Transducers that Linearly Contract on Activation," Science Robotics, Jan. 5, 2018, vol. 3, eaar3276, 11 pages.

Ladd C.D., "Design and Characterization of Electroresponsive Polymers Based on the Johnsen-Rahbek Effect" MSc Thesis, University of Pittsburgh, (deposited 2015, approved 2016), 55 Pages.

Laser D.J., et al., "A Review of Micropumps," Journal of Micromechanics and Microengineering, 2004, vol. 14, pp. R35-R64.

Niino T., et al., "Electrostatic Artificial Muscle: Compact, High-Power Linear Actuators with Multiple-Layer Structures," Proceedings IEEE Micro Electro Mechanical Systems—An Investigation of Micro Structures, Sensors, Actuators, Machines and Robotic Systems, 1994, pp. 130-135.

Oh K.W., et al., "A Review of Microvalves," Journal of Micromechanics and Microengineering, 2006, vol. 16, pp. R13-R39.

Qin S., et al., "Deep-Depletion Breakdown of Johnsen-Rahbek Type Electrostatic Chuck Operation for Semiconductor Processes," Journal of Applied Physics, 2008, vol. 104, 094902, 4 Pages.

Qin S., et al., "Wafer Dependence of Johnsen-Rahbek Type Electrostatic Chuck for Semiconductor Processes," Journal of Applied Physics, 2007, vol. 102, 064901, 4 Pages.

Rothemund P., et al., "HASEL Artificial Muscles for a New Generation of Lifelike Robots—Recent Progress and Future Opportunities," Advanced Materials, vol. 33(19), 2003375, May 13, 2021, 28 pages.

Shikida M., et al., "Electrostatically Driven Gas Valve with High Conductance," Journal of Microelectromechanical Systems, Jun. 1994, vol. 3 (2), pp. 76-80.

Shultz C.D., et al., "Surface Haptics via Electroadhesion: Expanding Electrovibration with Johnsen and Rahbek," 2015 IEEE World Haptics Conference (WHC), Jun. 22-26, 2015, pp. 57-62.

Sirbu I.D., et al., "Electrostatic Actuator for Tactile Display Based on Hydraulically Coupled Dielectric Fluids and Soft Structures," Proceedings of SPIE, Electroactive Polymer Actuators and Devices (EAPAD) XXI, 109662D, Mar. 19, 2019, vol. 10966, 7 pages.

Taghavi M., et al., "Electro-Ribbon Actuators and Electro-Origami Robots," Science Robotics, Dec. 19, 2018, vol. 3, eaau9795, 13 pages.

Wen F., et al., "High Dielectric Permittivity and Low Dielectric Loss Nanocomposites based on Poly(VDF-TrFE-CTFE) and Graphene Nanosheets," Journal of Advanced Dielectrics, 2013, vol. 3, No. 2, 1350010, 6 Pages.

Zhang Z.G., et al., "Electrostatically Actuated Robotic Fish: Design and Control for High-Mobility Open-Loop Swimming," IEEE Transactions on Robotics, Feb. 2008, vol. 24 (1), pp. 118-129.

International Search Report and Written Opinion for International Application No. PCT/US2021/053481, dated Feb. 2, 2022, 14 pages.

* cited by examiner

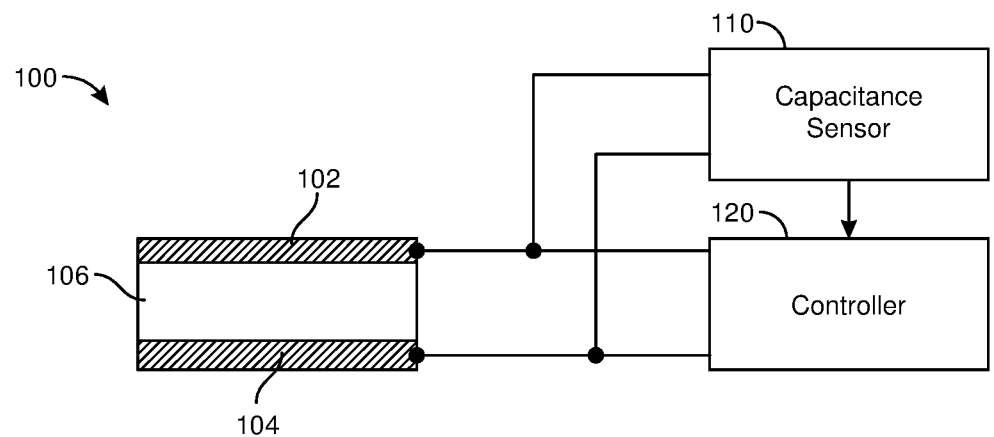
FIG. 1
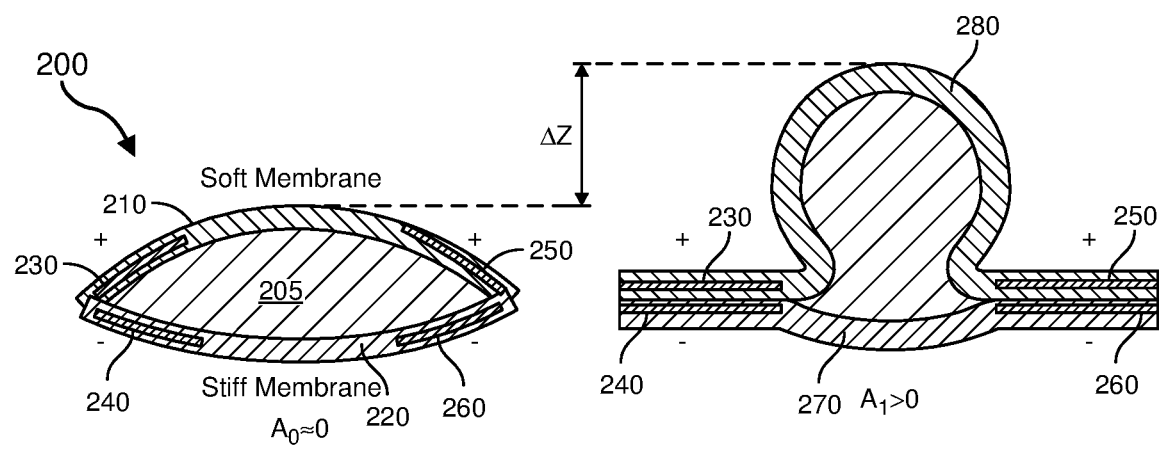
FIG. 2A     FIG. 2B

OPERATIONAL FEEDBACK USING CAPACITIVE SENSING

CROSS REFERENCE TO RELATED APPLICATION

This application claims the benefit of U.S. Provisional Application No. 63/089,034, filed 8 Oct. 2020, the disclosure of which is incorporated, in its entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 1 shows a simplified schematic of an actuator including a capacitive sensor, according to some embodiments.

FIGS. 2A-2B show an example actuator configuration including at least one membrane supporting an electrode, according to some embodiments.

Figure 3:
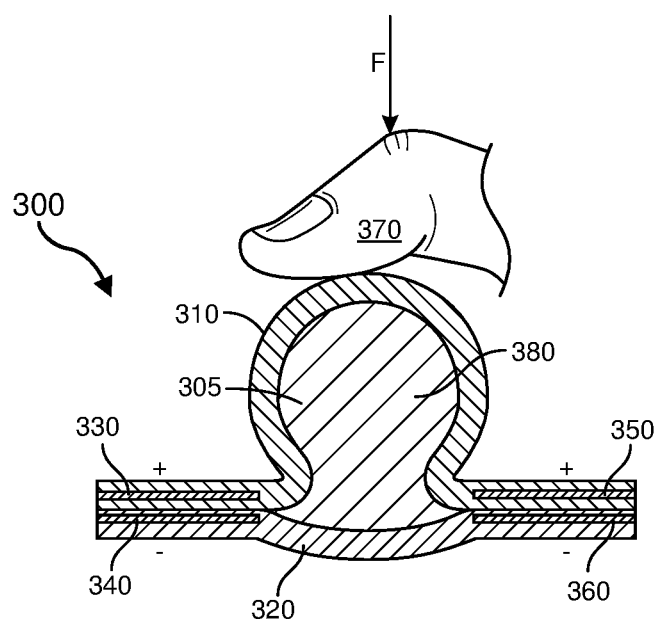
FIG. 3 shows an example actuator used as a haptic device or sensor, according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and are described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Devices may be used to provide haptic signals to a user and may also receive touch signals from a user. An example device may function as an actuator and/or a sensor and may include a deformable element, such as a membrane. The membrane shape may be modified by adjusting the electric potential between a pair of electrodes, one of which may be located on the membrane. The displacement of a portion of the membrane may be adjusted by modifying the electric potential, which may be used to provide a perceptible haptic signal (such as a perceptible tactile sensation) to a user. However, the actual displacement may be influenced by other factors, such as a force applied to the membrane by the user. Hence, it may be very useful to determine the actual displacement of the membrane and/or the contact force from the user, and to modify the electric potential according to the determined displacement and/or contact force.

The present disclosure is generally directed to devices, such as transducers, actuators, and/or sensors. As is explained in greater detail below, embodiments of the present disclosure may include a device, such as an actuator and/or touch sensor, including a capacitance sensor. Example devices may include an electrostatic or piezoelectric haptic actuator. A capacitance sensor may be integrated with the device to provide real-time feedback and allow dynamic control of the device.

An example device may include a membrane, a first electrode supported by the membrane, a second electrode, a capacitance sensor configured to determine a capacitance measurement between the first electrode and the second electrode, and a controller configured to control an electrical potential applied between the first electrode and the second electrode. The controller may be configured to modify the electrical potential based on the capacitance measurement. Example devices may include one or more flexible membrane that may, at least in part, define an enclosure that is at least partially filled with a dielectric fluid. Examples also include associated methods and systems.

Figure 4:
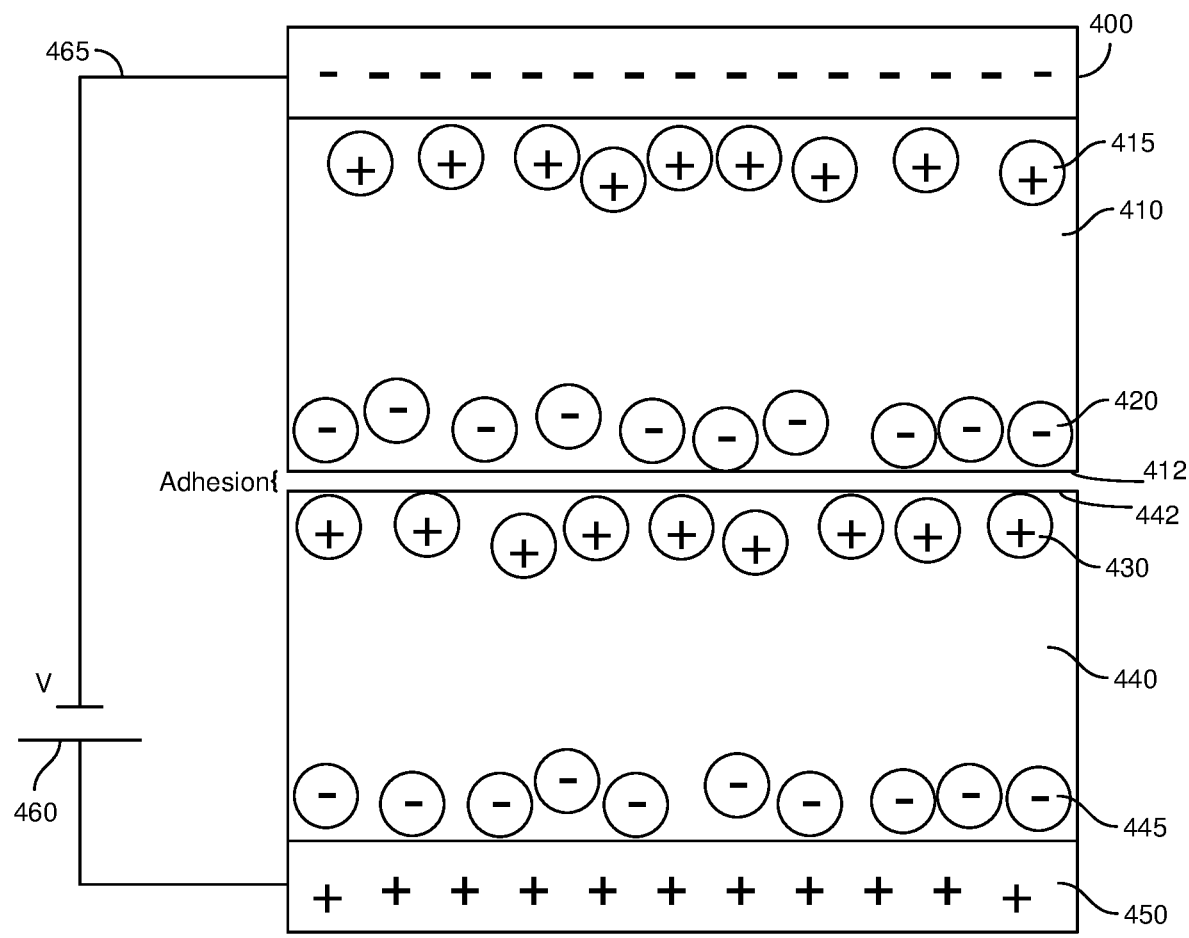
FIG. 4 illustrates electrostatic adhesion between two layers of low electrical conductivity, which may be used in some embodiments.
Figure 5:
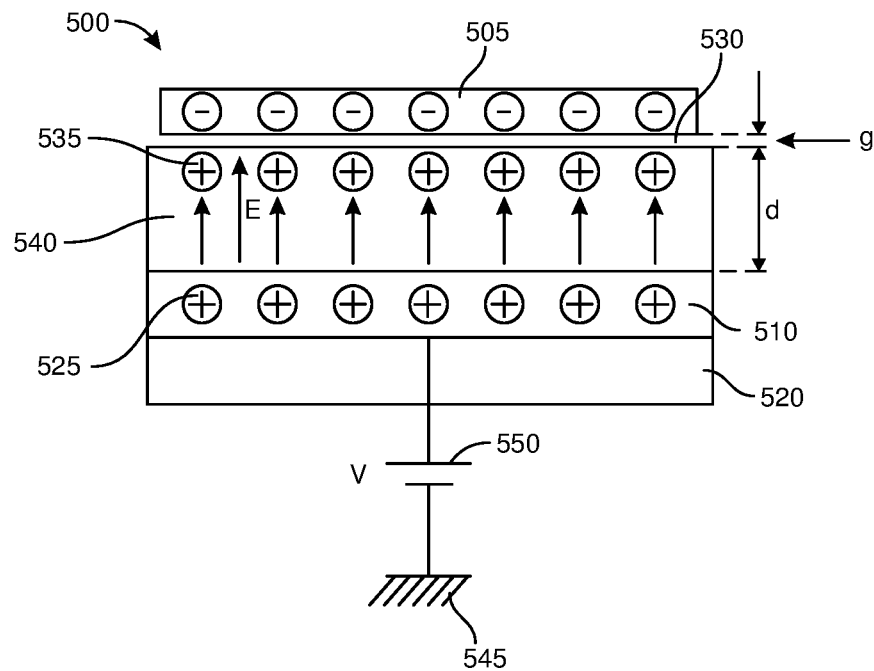
FIG. 5 illustrates electrostatic adhesion between an electrode and a layer of low electrical conductivity, which may be used in some embodiments.
Figure 9:
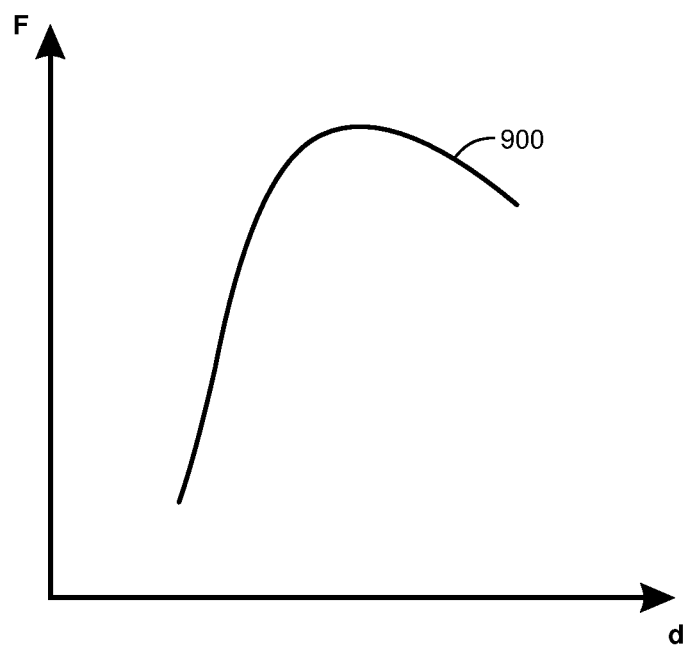
FIG. 9 shows a possible force-displacement relationship.
Figures 10A, 10B:
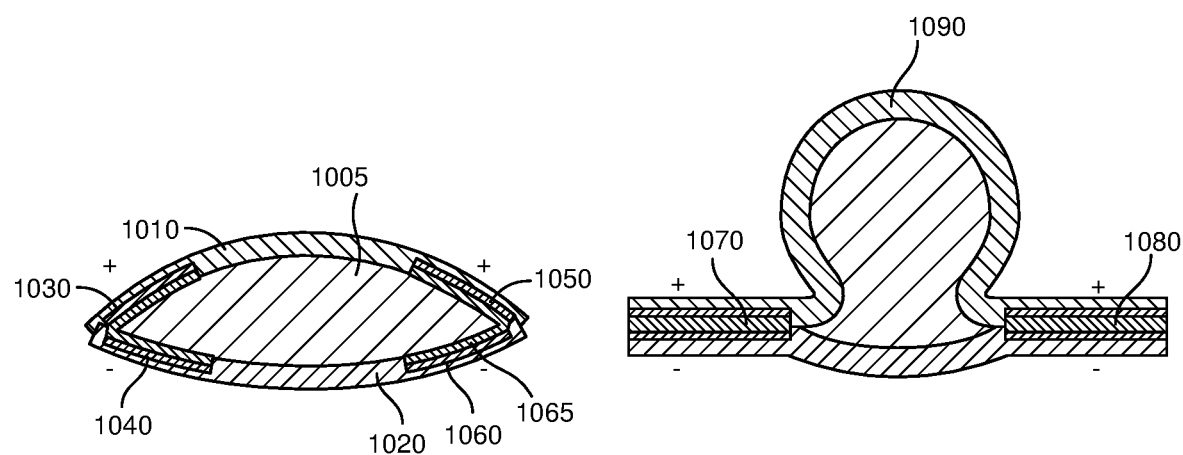
FIG. 10A-10B further illustrate electrostatic attraction between actuator layers, according to some embodiments.
Figure 11A:
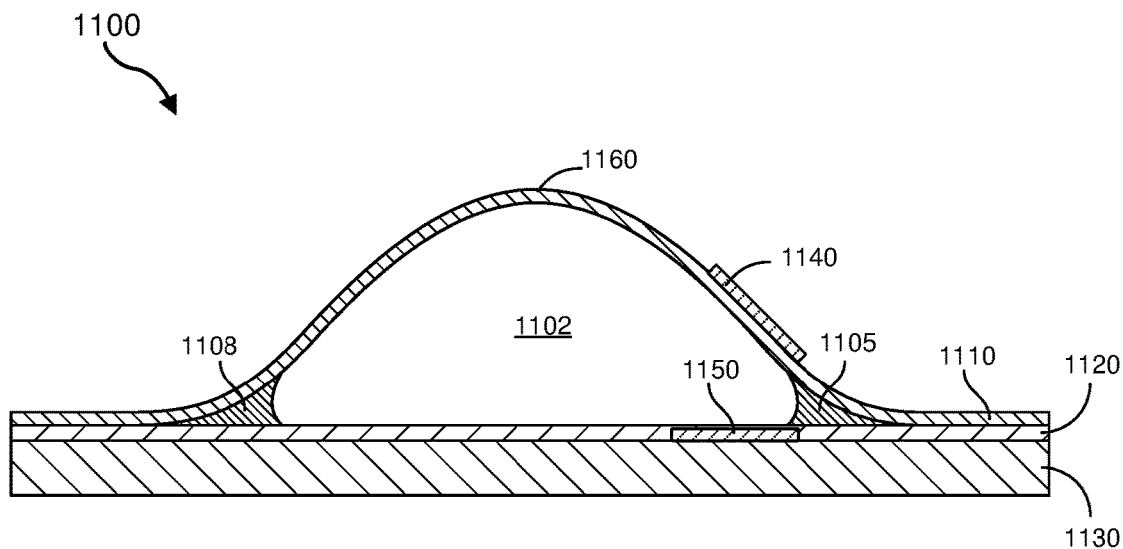
FIGS. 11A-11B illustrate another example actuator, according to some embodiments.

The following provides, with reference to FIGS. 1-22, a detailed description of actuator configurations and associated methods and applications. FIG. 1 is a simplified schematic of an actuator that may include a capacitance-based control. FIGS. 2A, 2B, and 3 show example actuator configurations. FIGS. 4 and 5 illustrate electrostatic adhesion including Johnsen-Rahbek effects. FIGS. 6A-6C, 7A-7B, and 8A-8B illustrate example device configurations that may be implemented in wearable devices. FIG. 9 shows a possible force-displacement relationship. FIGS. 10A and 10B further illustrate electrostatic attraction between actuator layers, which may be present in zipped states. FIGS. 11A-

Figure 15:
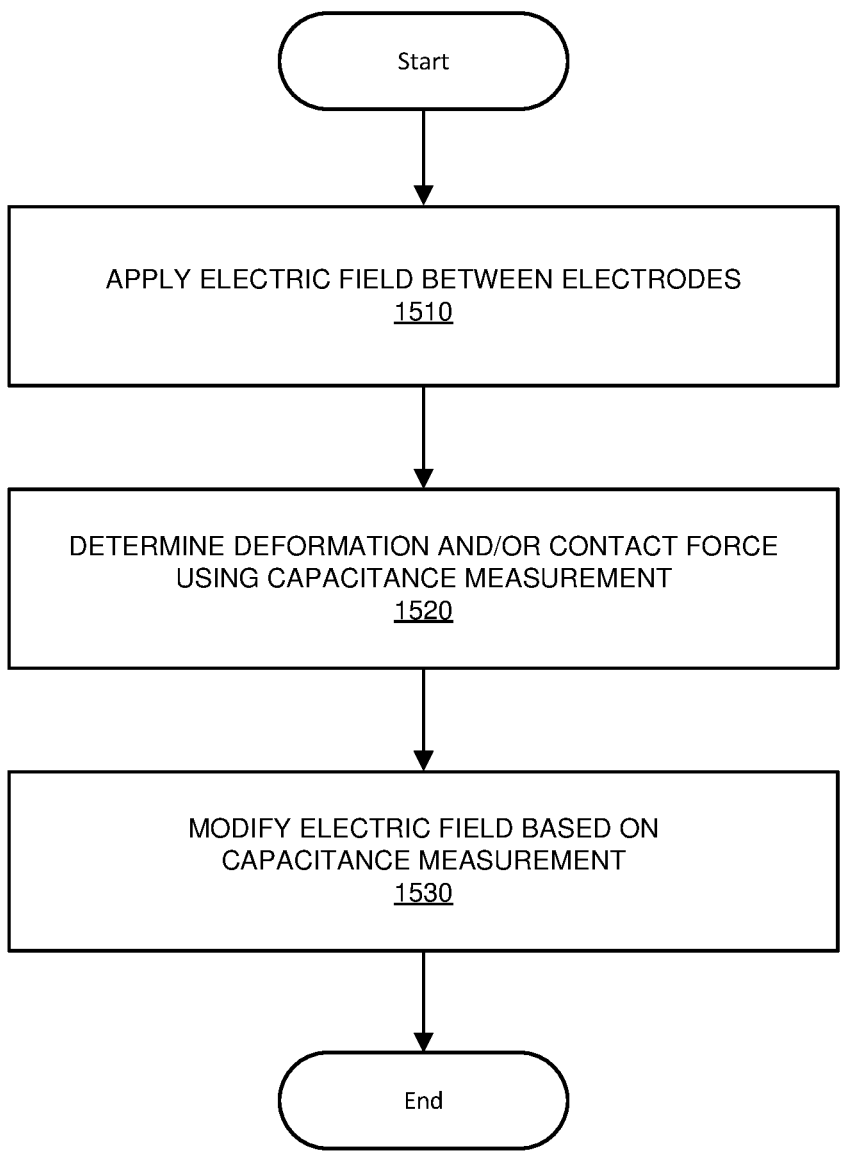
FIG. 15 illustrates an example method of operating an actuator.
Figure 16:
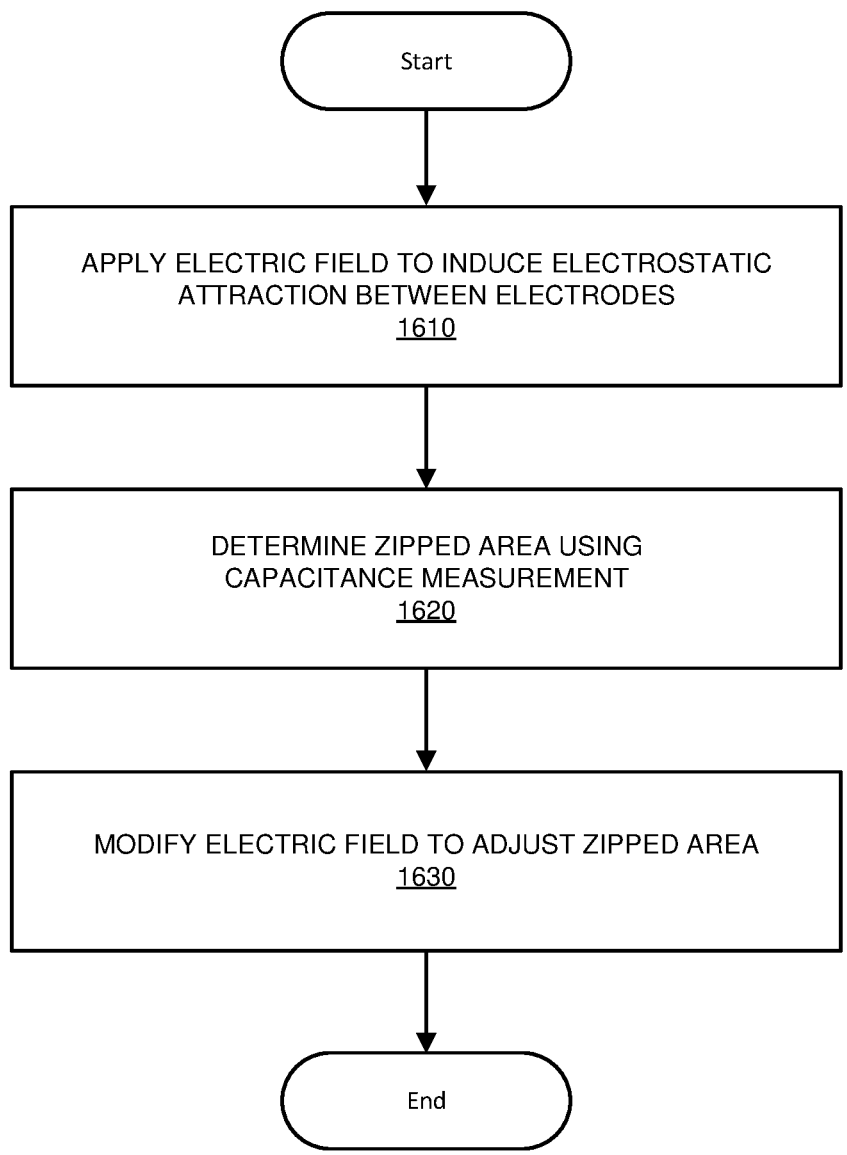
FIG. 16 illustrates a further example method of operating an actuator.
Figure 17:
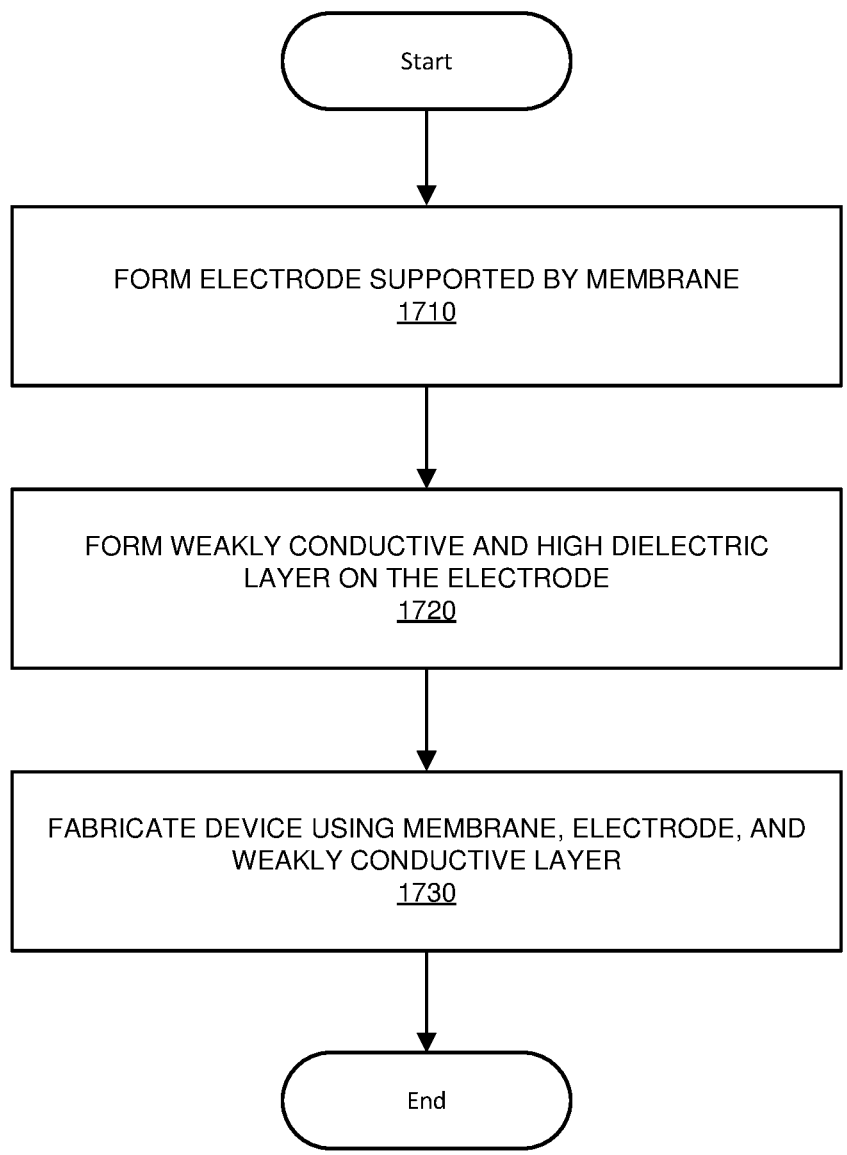
FIG. 17 illustrates an example method of fabricating an actuator.

11B, 12, 13A-13B, and 14A-14B illustrate further example device configurations. FIGS. 15-17 illustrate example methods. FIGS. 18-22 illustrate example augmented-reality (AR) and virtual reality (VR) devices capable of incorporating (or being used in connection with) the various embodiments described herein.

In some examples, an actuator may include a pair of opposed electrodes and one or more deformable membranes, such as flexible membranes. The one or more membranes may partially define an enclosure that may at least in part enclose a dielectric fluid. The electrodes may be separated by one or more layers, such as portions of the one or more membranes, a dielectric fluid, or one or more weakly electrically conductive layers. In some examples, an example device may be an actuator, such as a tactile actuator, and may be configured to provide perceptible tactile sensations to a user by adjusting the electric potential applied between the pair of opposed electrodes.

In some examples, an actuator may have a measurable capacitance that may vary as a function of the degree of actuation of the actuator. Control of the actuator may be adjusted based on the determined degree of actuation, such as displacement. The degree of actuation may be characterized by a displacement of at least a portion of a membrane, relative to a reference state of the device. Contact force may also modify the zipped area and hence the capacitance. The measured capacitance may be used to determine the displacement and/or an external force (such as a user contact force) acting on the device. The reference state may be the state in which the electrodes are closest together; for example, a zipped state. In some examples, an actuator may be in an at least partially zipped state. In this context, a zipped state may be one in which opposite membranes may be electrostatically adhered to each other, or may be substantially adjacent so that opposite electrodes are closer to each other than in other non-zipped states. Zipped states are discussed in more detail below.

In some examples, a device may include a flexible membrane supporting a flexible electrode and a generally opposed electrode that may be located on a second membrane or on a substrate. The device may have a zipped state in which the electrodes are electrostatically attracted together. In a zipped state, the dielectric fluid may be displaced (e.g., substantially or generally excluded) from between at least a portion of the electrodes. The zipped state may correspond to the electrodes being as close together as physically allowed by any intervening layers (such as one or more membranes, layers, or portions thereof). The device may have a zipped area, which may correspond to an area of the device in which the zipped state is achieved. For a given electrode, the zipped area corresponding to that electrode may vary between zero (e.g., in which the electrode is sufficiently distant from an opposed electrode such that appreciable dielectric fluid may enter the region between the electrodes), partially zipped states (e.g., in which dielectric fluid is displaced from between a portion of the electrode and a corresponding portion of an opposed electrode), and a completely zipped state in which dielectric fluid is generally excluded from between the electrode and an opposed electrode. In a zipped state, the dielectric fluid may be displaced (e.g., generally urged out) from between the electrodes by electrostatic attraction between the electrodes, or between one or more layers formed thereon.

In some examples, the capacitance between opposed electrodes may be generally proportional to the zipped area associated with the electrodes. For example, the capacitance of non-zipped areas may be relatively small compared to those of the zipped areas due to the greater electrode separation. In some examples, the zipped area may be related to a displacement output of the device, such as the displacement of a transducer. For example, a dielectric fluid may be generally excluded from the zipped area, increasing a displacement of another portion of the actuator. This is further discussed below.

In some examples, a zipped area may be related to a force applied to one or more deformable membranes by a user. For example, a force applied by a user may force a dielectric fluid between opposed electrodes, overcoming any electrostatic attraction between the electrodes, and reducing the measured capacitance between the electrodes.

In some examples, a measured capacitance in conjunction with a known driving voltage may be used to determine a displacement of a deformable membrane (e.g., relative to a reference conformation). In some examples, an external force (sometimes referred to as a contact force) may be determined from the capacitance, together with the displacement. The displacement value and/or contact force may be incorporated into a feedback signal usable to control the displacement as well as an output pressure and thereby desirably impact a user's interaction with a system that includes the actuator.

In some examples, an electric potential (e.g., an alternating and/or direct voltage) may be applied between the electrodes to improve the dynamic range of the capacitance measurement. For example, an electrical potential may be applied between the electrodes to maintain the device in a zipped or a partially zipped state. This may result in a relatively large capacitance change in response to a small change in an applied force. This may also result in a relatively large displacement in response to a small change in the electric potential. Such a configuration may also advantageously improve the signal-to-noise ratio for force detection and/or electrically-controlled actuation using capacitance-based feedback.

According to some embodiments, the required voltage used to drive a haptic actuator may be decreased in accordance with the Johnsen-Rahbek effect by replacing at least a portion of a dielectric membrane (e.g., the deformable membrane) with a weakly electrically conductive membrane (e.g., $r_{bulk}$ $^{18}$ $10^{10-12}$ ohm.cm), or by including a weakly electrically conductive layer between an electrode and the dielectric fluid (and/or the opposed electrode, or any layers formed thereon). The weakly electrically conductive layer (e.g., a portion of a membrane) may be located between the inner surface of an electrode and the dielectric fluid.

In addition to, or in lieu of, the use of capacitance measurements to adjust the control of a device (e.g., a haptic actuator), capacitance measurements may be used to help generate or modify a force-displacement curve to provide any desired tactile feel for a user input device, such as a user input device within an augmented-reality or virtual-reality environment. The force-displacement curves for any device may be simulated, for example by modifying the electrostatic attraction between electrodes as a function of one or more of a degree of actuation, a user input force, a displacement (e.g., of part of a membrane), or other parameter. Example devices may be configured to provide a haptic simulation of the feel of a mechanical keyboard that provides the user with the sensory experience of typing in a virtual-reality or augmented-reality setting. For example, the controller may use a lookup table to modify the electric potential applied between electrodes according to a received capacitance measurement.

In some examples, at least part of the membrane may include a weakly electrically conductive membrane. In this context, a weakly electrically conductive membrane may have a bulk resistivity in the approximate range of $10^{10}$-$10^{12}$ ohm.cm. Electrostatic attraction between proximate portions of opposite membranes (e.g., the Johnsen-Rahbek effect) may be used to modify the properties of the device, and, in some examples, may allow a reduction in the voltage required to drive the actuator. In some examples, a weakly electrically conductive layer may cover at least a portion of the inner surface of the electrodes. In this context, the inner portion of an electrode may face towards the dielectric fluid (if present) and/or the opposite electrode. A weakly conductive layer (e.g., including a weakly conductive high dielectric constant material) may allow static charges to dissipate, such that static charges do not accumulate within the weakly conductive layer. This may improve the actuator response, and may allow higher frequency actuation. In some examples, electrostatic attraction (e.g., using the Johnsen-Rahbek effect) allows control signals to use direct voltages rather than alternating voltages, which may allow simplified driving electronics.

Features from any of the embodiments described herein may be used in combination with one another in accordance with the general principles described herein. These and other embodiments, features, and advantages will be more fully understood upon reading the detailed description in conjunction with the accompanying drawings and claims.

FIG. 1 shows a simplified schematic of an example device, such as an actuator including a capacitive sensor, according to some embodiments. The device, shown generally at 100, includes a pair of electrodes (102 and 104) separated by a dielectric medium 106. In this simplified schematic, optional supporting membranes and edge seals are not shown. The controller 120 provides a control signal, such as an electric potential, to the electrodes, which may adjust the actuator as described in more detail below. The capacitance sensor 110 may be configured to measure the capacitance between the electrodes. The capacitance may vary as a function of the degree of actuation, and capacitance and/or degree of actuation data may be provided by the capacitance sensor to the controller. The actual degree of actuation determined from the capacitance measurement may be compared with the intended degree of actuation corresponding to the control signal. The capacitance measurement may be used to adjust the control signal provided to the actuator, as described further below. In some examples, a comparison between the actual and intended degrees of actuation may allow modification of the control signal, and in some examples may be used to determine an external force acting on a device, such as a user-exerted force or a preload force.

FIGS. 2A and 2B illustrate an example actuator configuration, which may include a pair of membranes, with each membrane supporting one or more electrodes.

FIG. 2A shows actuator 200 including dielectric fluid 205, first membrane 210, second membrane 220, and electrodes 230, 240, 250, and 260. In some examples, the first membrane 210 may be a relatively soft membrane and the second membrane 220 may be a relatively hard membrane. Different portions of membrane 210 and 220 may be made of different materials, and different portions of the membrane may exhibit different stiffness. This aspect is discussed further below. The electrodes 230, 240, 250, and 260 may be embedded in the membrane material. FIG. 2A shows the actuator in an unzipped state. $A_O$, the area of the zipped state in this configuration, is approximately zero.

In some examples, membranes 210 and 220 may be generally uniform, and in some examples may be generally similar. However, in some examples, different membranes may include different materials, and may have different properties. In some examples, different portions of a particular membrane (e.g., membrane 210 and/or 220) may include different materials or may have different properties as desired. For example, a portion of a membrane (e.g., a central portion or a peripheral portion) may have reduced stiffness, such as greater elasticity.

FIG. 2B shows the actuator 200 in another configuration. A control voltage is applied between the electrodes, drawing the electrodes close to each other. Electrostatic attraction between the electrodes may drive the dielectric fluid 205 out from between the electrodes and into a central portion, distorting corresponding membrane portions 270 and 280 outwards. In various examples, the electrodes may be located on an inner or outer surface of the membrane, or may be embedded within a membrane.

The capacitance between the electrodes may be determined using Equation 1 below:

$$C = \frac{dQ}{dV} = \epsilon_0 \epsilon_r \frac{A}{d} \quad \text{(Equation 1)}$$

For unzipped portions of the device (where the electrodes are not zipped together), the effective distance between the two electrodes d may be large enough that the capacitance contribution from the unzipped portion may be neglected. This approximation may be reasonable even if the unzipped portion does not approximate a parallel plate capacitor.

The capacitance of a zipper actuator may be determined as approximately:

$$C \approx \epsilon_0 \epsilon_r \frac{A_{zip}}{t_1 + t_2} \quad \text{(Equation 2)}$$

where $t_1$ and $t_2$ are the thicknesses of layers located between the electrodes.

FIG. 3 shows an example device, which may have a transducer configuration that may be used as an actuator (e.g., a haptic device) and/or sensor, according to some embodiments. The device 300 may have a similar configuration to the device of FIG. 2B, and may include dielectric fluid 305, first membrane 310, second membrane 320, and electrodes 330, 340, 350, and 360. Operating as an actuator, a voltage may be applied between the opposite electrodes (e.g., between electrodes 330 and 340 and between electrodes 350 and 360), inducing electrostatic attraction between the electrodes and hence urging corresponding portions of the first membrane 310 and the second membranes 320 together and displacing any dielectric fluid 305 between corresponding portions of the membrane into the central portion 380 of the device. The displacement of the dielectric fluid may be used to urge a central portion of the first membrane 310 towards a body part of a user, such as finger 370. This deformation of the first membrane away from the second membrane may be used as a haptic device, and may also be described as the formation of a fluid-filled bubble or expanded portion of the device. The displacement of the central portion of the first membrane 310 may depend on the voltage applied between the electrodes, and may also depend on a contact force exerted by a body part (such as a finger) on the membrane. Capacitance measurements between electrodes may be used to determine the displacement and/or the contact force.

In some examples, the device of FIG. 3 may be used as a sensor and a body part (e.g., a finger) may be used to apply a force (illustrated by the arrow denoted F) to the central portion 380 of the transducer. This force may displace dielectric fluid from the central portion 380 to between the electrodes, reducing the measured capacitance between the electrodes. The measured capacitance between opposite electrodes may be used to estimate displacement (e.g., in an actuator mode) or force (e.g., in a sensor mode). An example device may be used as an actuator (e.g., a haptic device) and/or as a sensor (e.g., a force sensor). In some examples, input and/or output forces or displacements may include shear forces and/or shear displacements.

The zipped area of a device may be determined by one or more factors, such as the application of electric potentials to two or more electrodes, an external force (such as a force applied by a user to a device), the mechanical properties of the membranes, the internal pressure of the dielectric fluid, or other factors.

As the zipped area becomes larger, more dielectric fluid may be squeezed out from between the electrodes and into a portion of the device (e.g., an expandable portion, such as a central portion not located between the electrodes). In a haptic device, more displacement may be generated (e.g., toward user's skin) by an increased electrostatic attraction between the electrodes. In a sensor configuration, a larger tactile pressure applied to a portion of the device (e.g., a compressible portion, such as a central portion not having electrodes) by a body part of a user (e.g., a finger) to the device may tend to urge the dielectric fluid into an emerging volume between the electrodes, appreciably reducing the zipped area. The reduction in zipped area may be detected using capacitance measurements.

The zipped area and/or output displacement of a transducer may be determined by the voltage applied to the electrodes and any tactile pressure exerted on the device. Capacitance and voltage measurements may be used to determine the displacement of the transducer (e.g., for an actuator) or external pressure exerted on the device (e.g., as a sensor). Capacitance measurements may also be used to determine displacement and/or external pressure or force (e.g., the device may function as an actuator, a displacement sensor, and/or a force sensor).

Capacitance measurements may be used to determine the output pressure and/or displacement provided by an actuator. Capacitance measurements may also be used to determined input pressure or input displacement applied to a sensor. Example devices may function as an actuator, a sensor, or may operate in both an actuator and a sensor operational modes. An operational mode may be selected by a controller.

In some examples, a device may be subjected to a preload force. The preload force may be determined by capacitance measurements with no applied voltage.

In some examples, a capacitance measurement may be used as a feedback signal to allow active control of a device, such as active control of pressure and/or displacement. The control parameters of a device (e.g., applied voltage) may be adjusted to obtain a desired force and/or displacement output, using capacitance measurements to adjust the applied voltage to obtain a desired device output. This may be performed as a calibration step before use of a device, or at intervals during device operation.

In some examples, a device may include a transducer, such as an actuator and/or sensor, which may include an expandable portion (e.g., a central portion and/or a peripheral portion) and may include electrodes that allow a control signal to be applied to the device, and in some examples may also allow a capacitance measurement that provides data related to the displacement of the expandable portion of the device and/or an external force applied to the device. In some examples, a direct voltage may be applied between opposite electrode pairs of the device to adjust the dynamic range of the capacitance measurement.

For example, in a force sensing mode, a direct voltage may be applied to opposed electrodes of the device to maintain the device in a state close to a zipped state. The direct voltage may be used to reduce the electrode separation. The device may then exhibit relatively large capacitance changes in response to small changes in an external applied force, such as a user's touch. The external applied force may represent an intended user input into a device, and recognition of the intended user input may improve the responsiveness of an augmented-reality or virtual-reality system (which may include devices as described herein, which may be used as, e.g., haptic devices and/or user input sensors). This may allow higher signal to noise measurements of capacitance measurements, and hence of sensed force changes. Similarly, in an actuator configuration, a direct voltage may be applied to the electrodes so that the actuator is relatively close to a zipped state (compared to the case where no voltage is applied). The actuator may then respond to relatively small changes in applied signal voltages. The response time of an actuator or sensor may also be appreciably reduced by applying a direct voltage to adjust the device configuration to, for example, almost zipped, just unzipped, or to a partially zipped configuration.

In some examples, capacitance may be determined at intervals with a sample rate, or measured continuously (e.g., using an analog capacitance measurement). The sample rate may be determined based on one or more factors, such as how often the feedback is required for the control system or the noise present in the system. The sample rate may be a fixed rate, or, in some examples, the sample rate could be dynamically adjusted based on the real-time requirements. In some examples, the sample rate may be based on a rate of change of measured capacitance. The sample rate may be increased, with the time period between capacitance measurements reduced, if a capacitance change greater than a threshold value is detected between measurements. The sample rate may be adjusted (e.g., increased) if variations in capacitance measurements indicate dynamic changes and/or the presence of noise. The integration time (e.g., capacitance sensor measurement sampling time) or sample rate (which may also be termed sample frequency) may be adjusted. For example, the sample rate may be varied to reduce the effects of narrow-band noise sources (e.g., using a frequency hopping approach). Capacitance measurements may include averaging of measurements, such as digital averaging of samples, and may use variable integration times to provide effective averaging of values. Capacitance measurements may include data filtering, such as one or more of FIR (finite impulse response) or IIR (infinite impulse response) digital filtering, or non-linear (e.g., median) filtering. The device may be sampled discretely or continuously at a rate chosen to avoid measurement noise, either in real-time or at the time of the design, and the resulting measurements can be filtered or averaged to further mitigate the impact of noise sources.

FIG. 4 illustrates electrostatic adhesion within part of a device including first electrode 400, second electrode 450, and layers 410 and 440 disposed on the inner surfaces of the first and second electrodes respectively. The layers 410 and 440 may be weakly electrically conductive layers having a relatively low electrical conductivity compared to that of the first and second electrodes. An external controller, represented here by the battery symbol 460, may be used to apply a potential difference between the electrodes through electrical connections such as electrical connection 465.

FIG. 4 shows a negative potential applied to the first electrode 400 (which may here be termed the negative electrode) and a positive potential applied to the second electrode 450 (which may here be termed the positive electrode). In this example, the applied potentials polarize the weakly electrically conductive layers 410 and 440. For example, positive charge 415 may be drawn to the negative electrode and negative charge 445 may be drawn to the positive electrode. As a result of these electrical potential induced charge movements, the layer surfaces 412 and 442 may accumulate charges opposite to those induced near the electrodes for each respective layer. These charges are shown at 420 and 430, and may induce appreciable electrostatic adhesion between the layer surfaces 412 and 442. The layer surfaces 412 and 442 may be effectively in contact so as to exclude dielectric fluid from between the electrodes.

The layer surfaces are shown as smooth, but a closer view of local portions of the layer surfaces may reveal a degree of layer surface roughness. However, layer surface roughness may not greatly affect operation of the device. The electrodes may be supported by separate membranes, which are not shown in FIG. 4. In some examples, weakly electrically conductive layers such as 410 and 440 may form a portion of a membrane.

FIG. 5 illustrates electrostatic adhesion between an electrode and a layer of low electrical conductivity, which may occur within at least a portion of an example device. The illustrated portion of device 500 may include first electrode 505, second electrode 510, membrane 520, and weakly electrically conductive layer 540 (of thickness d). An electric potential is applied between the electrodes (e.g., using voltage source 550, which may be provided by the controller), so that the first electrode is negatively charged, and the second electrode is positively charged (as illustrated). Voltages may be applied relative to a common ground potential (545) or using any suitable connection scheme. The electrical potential between the electrodes may induce an electric polarization of the weakly electrically conductive layer 540, so that a positively charged layer 535 may form along a surface of the weakly electrically conductive layer 540 proximate the (negative) first electrode 505. Electrostatic attraction between the first electrode and the weakly electrically conductive layer 540 may generate a zipped state, in which the gap 530 (having a gap thickness denoted g) is effectively minimized. Dielectric fluid may be substantially excluded from between the weakly electrically conductive layer 540 and the first electrode 505, and hence dielectric fluid may be substantially excluded from between the first and second electrodes.

Figure 6A:
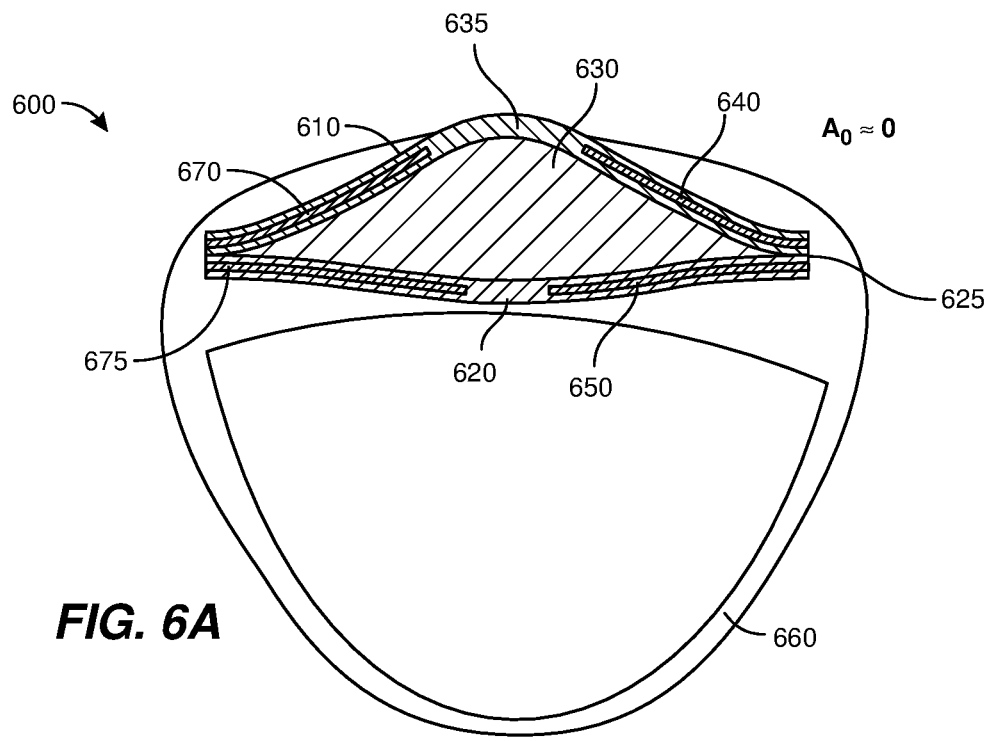
FIGS. 6A-6C illustrate an example finger-shear actuator, according to some embodiments.
Figure 6B:
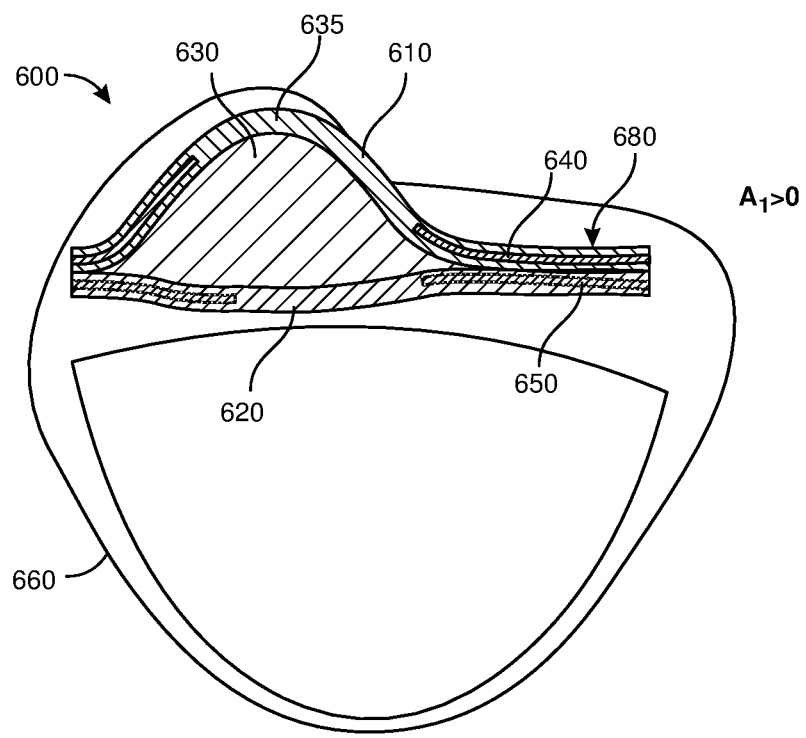
Figure 6C:
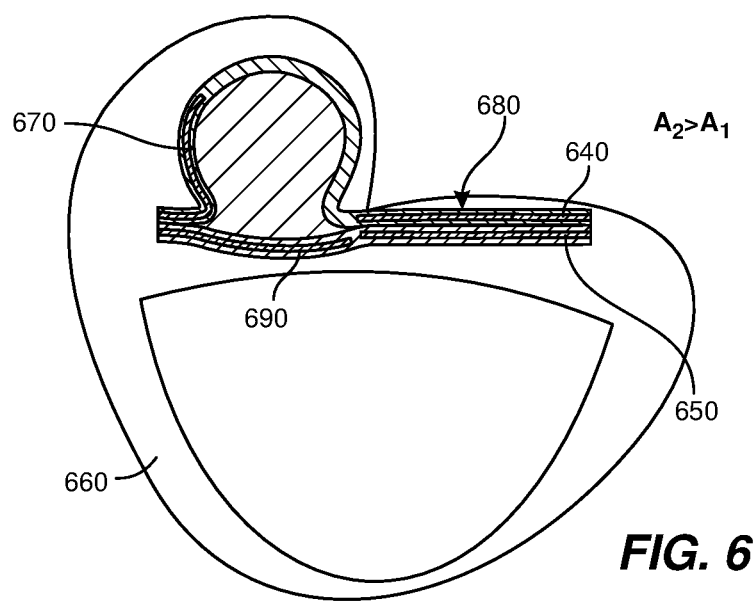

FIGS. 6A-6C illustrate an example wristband including a finger shear actuator, according to some embodiments. Haptic signals may be applied to a finger (or other body part) of a user, such as forces exerted radially inwards (e.g., towards the center of the finger), across the finger, or along other directions. An example device may include a strap that wraps around a body part, such as a finger. When one side of the device expands, the strap may be pulled towards the expanded side, resulting in a shear force being applied to the body part.

FIG. 6A shows a wearable device 600. The wearable device 600 may include a finger shear actuator and a strap that wraps around a finger, and when one side of the actuator bulges out, at least a portion of the strap may move towards the expanded part of the actuator and apply a shear force to the finger. In some examples, the function of the strap may be provided by a portion of a wearable device, such as a glove. In some examples, the wearable device 600 may be configured to apply a shear force to a portion of the finger (e.g., a fingertip). The wearable device 600 includes a transducer including first membrane (610) and second membranes (620) enclosing dielectric fluid 630. The first and second membranes support opposed electrodes 640 and 650 respectively, and may also support a second pair of opposed electrodes at 670 and 675. The device may be supported around the finger of a user using strap 660. In some examples, a device may be configured to apply a shear force to any appropriate body part, using a suitably sized strap and one or more actuators. In some examples, strap 660 may include a finger strap, wristband, chest strap, head strap, or other element configured to encircle a body part. In some examples, the wearable device may be a glove, and the actuator may be located within a portion of the glove, such as proximate a fingertip.

In the configuration of FIG. 6A, an electrical potential applied between electrodes 640 and 650 may be insufficient to induce electrostatic attraction between the electrodes, and dielectric fluid may be distributed both within a central portion 635 (which may lack electrodes) and between the two pairs of opposed electrodes. The area of zipped electrodes in this configuration may be designated $A_0$, and in this example $A_0$ is approximately zero. The peripheral region 625, which may include an edge seal (not shown), may approximate a zipped state, but may be of negligible extent (or area).

FIG. 6B shows wearable device 600 having an electrical potential (voltage) applied between the electrodes 640 and 650. An electrostatic attraction between the electrodes induces a movement of the dielectric fluid out from between the electrodes and into a central portion 635 of the wearable device 600, which may be an expandable portion. This may induce a displacement of one or both of the membranes, particularly within the central portion 635. The fluid may also enter other portions of the device, such as the space between the second pair of electrodes (670 and 675). In this example device configuration, the left portion of the actuator bulges out and pulls the strap toward the left (as illustrated) and the strap applies a leftwards-directed shear force to the user's finger (e.g., to the fingertip). In other configurations, the right portion of the device may expand and apply a rightwards-directed shear force. The area of zipped electrodes 680 in this configuration may be designated $A_1$, and in this example $A_1$ is greater than zero. The wearable device 600 may be in a partially zipped state, in which the electrodes are not fully electrostatically attracted to, and substantially adjacent to, each other. In some examples, the movement of dielectric fluid and any corresponding changes in the exterior profile of the transducer (such as membrane displacement) may provide a perceptible tactile sensation (e.g., a haptic sensation or signal) for a user, such as a shear force. In some examples, a force applied to the central portion 635 may urge the dielectric fluid to enter between at least a portion of the opposed electrodes (640 and 650), reducing the area of zipped electrodes, and inducing a measurable change in capacitance between these electrodes. The force and/or displacement of the central portion may be determined using a capacitance measurement between one or more pairs of electrodes.

FIG. 6C shows a similar configuration, in which the electrical potential between electrodes 640 and 650 has been increased until the dielectric fluid is substantially excluded from between the electrodes 640 and 650. In this case, the zipped area of electrodes 640 and 650 achieves a maximum value, effectively equal to the overlapping area of the pair of electrodes. The central portion of the transducer may extend out further as the zipped area is increased. In some examples, the lower left electrode may extend further towards the lower right electrode, and may be larger in area than the upper left electrode. In some examples, the two lower electrodes (690 and 650, as illustrated) may be combined into a larger single electrode. The area of zipped electrodes 680 may be approximately unchanged by use of a single larger electrode supported by one membrane, as the zipped area may be determined by the overlapped area of a pair of electrodes and hence may be effectively determined by the area of the smaller electrode of a pair of opposed electrodes.

In some examples, one electrode pair may be switched off, and the other electrode pair may be turned on simultaneously (or approximately simultaneously). Charge stored on one pair of electrodes (e.g., the left pair of electrodes) may be transferred to the other pair of electrodes (e.g., the right pair of electrodes). The capacitive charge may be transferred from one pair of electrodes to another pair of electrodes, for example, from one part of the device to the other part. In this example, the capacitive charge may be transferred from one half of the device to the other half, and then may be transferred back. The charge transfer direction may alternate at intervals. This simultaneous (or near-simultaneous) actuation and de-actuation of different portions of a device allows the energy density of the actuator to be doubled. In this context, actuation may refer to application of a control signal between a pair of electrode. Also, this may allow a more rapid haptic action, because fluid may be actively driven out from one half of the device to the other half (e.g., from the left half into the right half, or vice versa). This mode of device operation may be referred to as a "push-pull" haptic device operation, and may allow an increased haptic density (e.g., improved spatial resolution of the haptic signal) for a particular number of enclosures (e.g., number of sealed fluid-filled chambers). Higher temporal frequency haptic signals may also be achieved using charge transfer between first and second pairs of electrodes.

In some examples, a device may include a plurality of pairs of electrodes. Pairs of electrode may be arranged around the periphery of an actuator, or otherwise located. The number of electrode pairs may be any number suitable to achieve the desired haptic signal. For example, four electrode pairs may be arranged around a fluid-filled enclosure and used to provide haptic shear signals directed along four directions (such as orthogonal directions). In some examples, the direction of the shear force may be perceived by the user to be rotating. In some examples, pairs of electrodes may be arranged along a particular direction (e.g., a linear or non-linear-path), and used to generate a sensation of movement (e.g., a sensation of creep, slide, brushing, abrasion, or other movement) along the particular direction.

A device may include one or more membranes, which may have similar or different properties (e.g., rigidity, thickness, transparency, elasticity, or other property). For example, in FIG. 6A, the second membrane 620 may be more rigid (e.g., less elastic) than the first membrane 610. The displacement may be greater for the less rigid (e.g., more elastic) membrane. Hence, in some examples, a device includes a pair of membranes defining an enclosure, with the membranes having different rigidities, and the less rigid membrane (e.g., more elastic membrane) may be used to provide a haptic signal, other displacement output, and/or receive a touch input from a user. The stiffness within the membrane may also vary, as the part of membrane directly covering the electrodes may be stiffer while the part without the electrode may be more stretchable. In some examples, a membrane may include a multi-layer structure that may include components of different stiffness, thickness, electrical conductivity, opacity, color, gas diffusivity, or other parameter. In some examples, a membrane may include one or more relatively elastic portions (compared to other portions of the membrane). For example, a portion of the membrane may include a higher component of elastomer than another portion, or and/may be a more elastic portion.

Figure 7A:
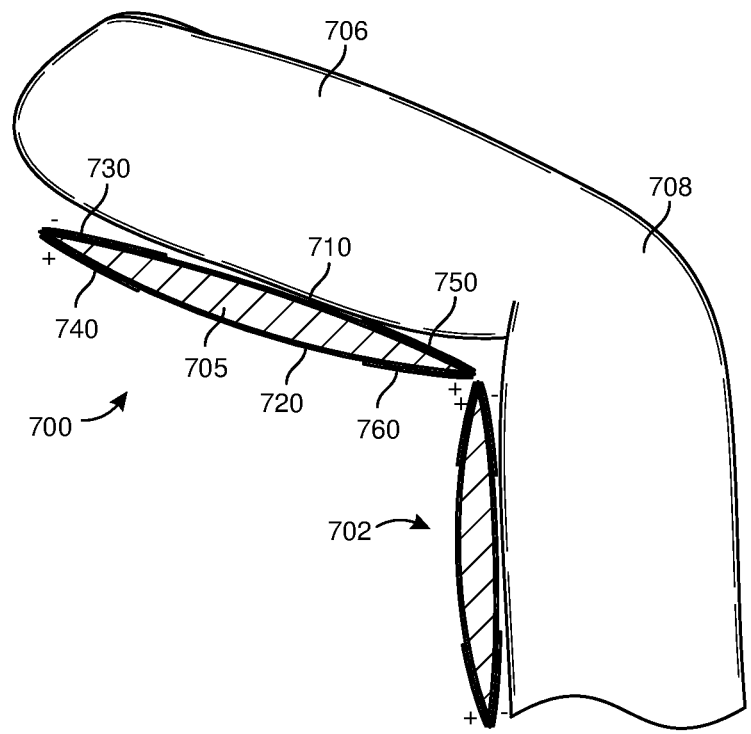
FIGS. 7A-7B illustrate an example device that may be located proximate a finger joint, according to some embodiments.
Figure 7B:
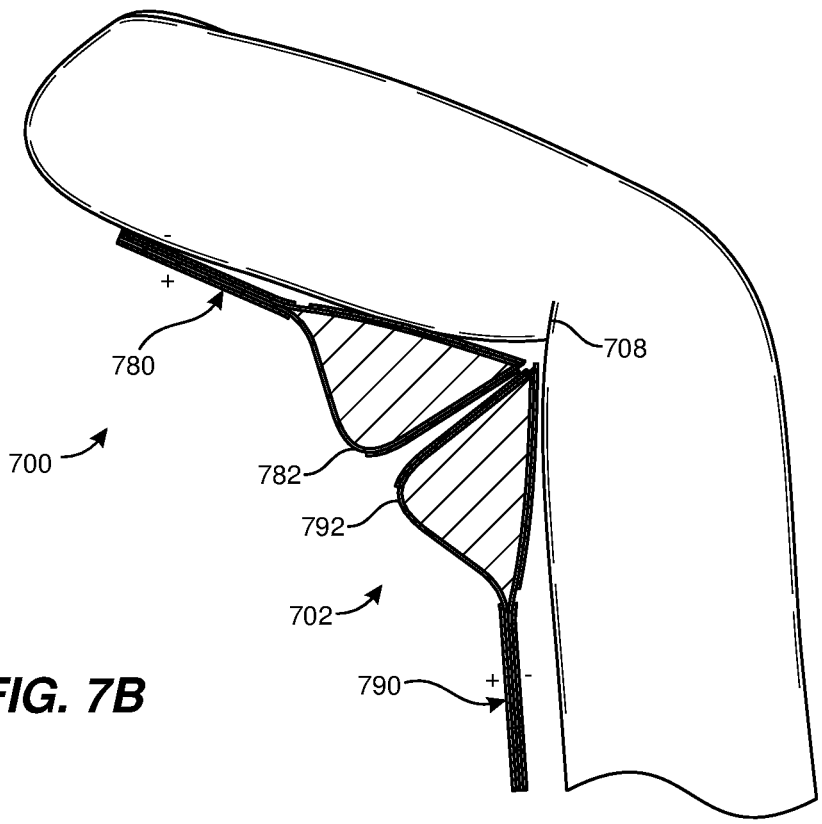

FIGS. 7A-7B illustrate an example device that may be located proximate a finger joint, according to some embodiments.

FIG. 7A illustrates a device including a pair of transducers (700 and 702), which may each be similar to the device discussed above in relation to FIG. 2A. Transducer 700 includes first and second membranes 710 and 720 respectively at least in part enclosing dielectric fluid 705. The transducer includes two opposed pairs of electrodes, a first pair of electrodes 730 and 740, and a second pair of electrodes 750 and 760. Transducer 702 may be generally similar to the transducer 700. Both transducers may be insulated (e.g., by insulating layers such as dielectric films, not shown for illustrative clarity) to protect users from electrical shocks and/or to avoid direct contact between different electrodes. The transducers may be located on different sides of a finger joint 708, in finger 706.

FIG. 7B shows a voltage applied between the outer pair of electrodes of each transducer, where the outer pair includes the electrodes located furthest from the finger joint 708. As a result of the potential difference between the electrodes, each transducer now exhibits a zipped area (780 and 790, respectively) in which the electrodes are electrostatically attracted to each other, and the dielectric fluid is expelled from between the outer electrodes into a central portion of each transducer (782 and 792, respectively). Dielectric fluid may also flow into the volume between the non-energized inner electrodes (electrodes closer to the joint), such as between electrodes 750 and 760 of transducer 700.

In some examples, an example device such as shown in FIGS. 7A and 7B may be configured as a haptic device, and may exert a pressure on the inside of the finger joint 708 that tends to open the finger joint (e.g., to increase the joint angle between adjacent finger segments, where a maximum joint angle value of 180 degrees corresponds to a straight finger). In some examples, an example device such as shown in FIGS. 7A and 7B may be used as a finger joint angle sensor. As a person bends the finger inwards, reducing the joint angle, dielectric fluid may be urged from the central portion and between the previously zipped electrodes. This may reduce a measured capacitance between the electrodes, and the measured capacitance may be used to determine a finger joint angle.

A wearable device, such as a glove, may include one or more devices such as described herein. For example, each finger of a glove may include at least one device, such as a transducer configured to act as a haptic device and/or a sensor (e.g., a joint angle sensor).

Figure 8A:
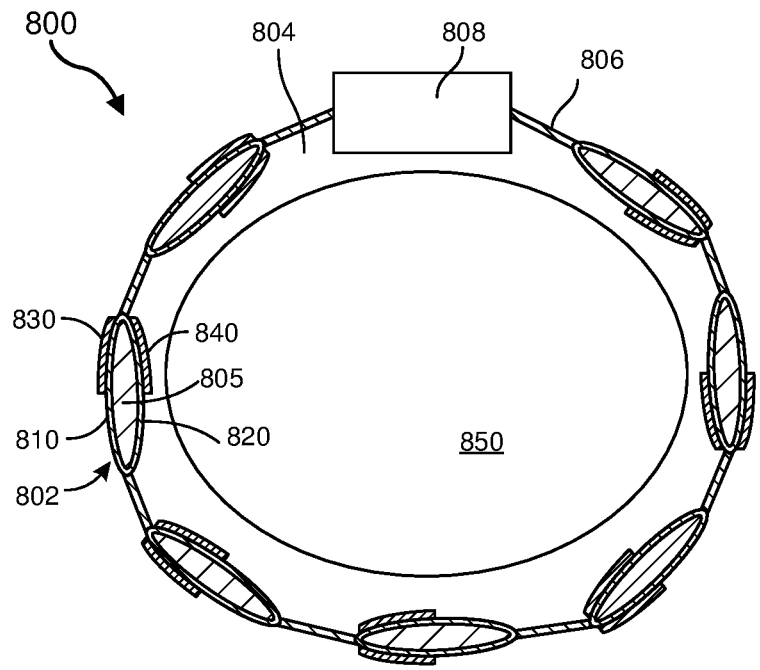
FIGS. 8A-8B illustrate an example device including a strap such as a wristband, according to some embodiments.
Figure 8B:
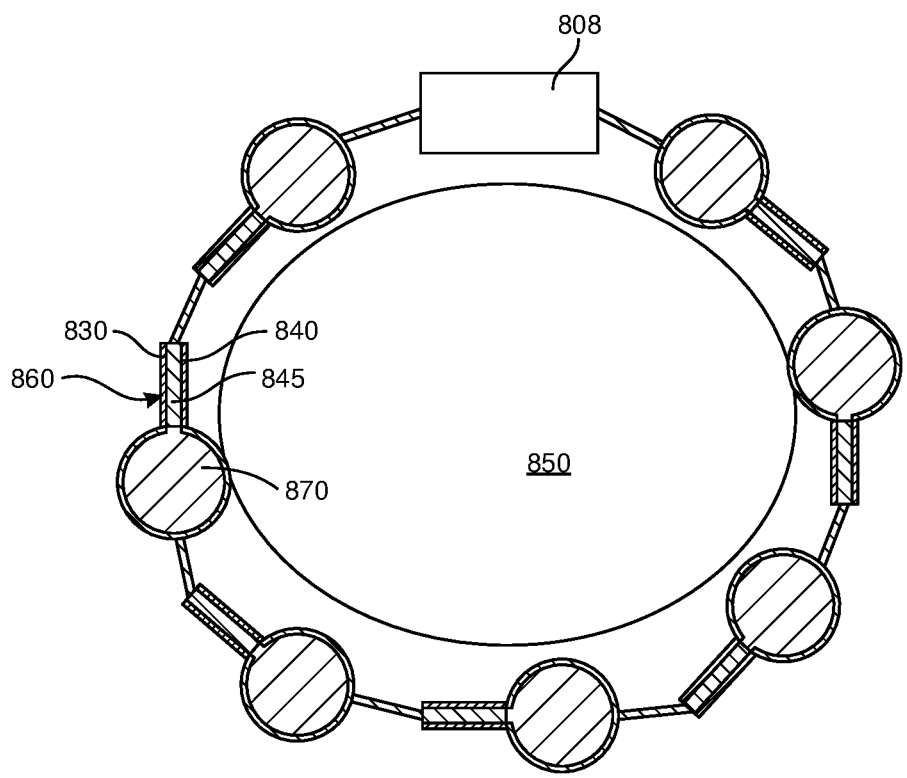

FIGS. 8A-8B illustrate an example wearable device 800 including a strap 806, such as a wristband. FIG. 8A shows the wearable device 800 including seven transducers, such as transducer 802, and a controller 808, interconnected by strap 806, which may include a flexible band, and which may be elastic. The number of transducers is not limited by this example, and may be any number, such as more or less than 7. The number of transducers may be, for example, between 1 and 20, for example, between 1 and 10. The strap 806 may include wiring or other electrical conductors configured to connect the controller to the transducers. The controller housing may include, or be connected to, a power supply such as a battery (not shown for clarity). The wearable device 800 may, when in use, encircle a body part 850 of a user, such as wrist. The gap 804 between the wearable device 800 and the body part 850 may be negligible, or may be defined by additional strap elements, spacers, or layers.

Each transducer, such as transducer 802, may include first and second membranes 810 and 820 respectively, enclosing a dielectric fluid 805, and supporting a pair of opposed electrodes including electrodes 840 and 850. FIG. 8A shows the wearable device in a configuration that may correspond to no electrical potential being applied between opposed electrodes of each transducer.

FIG. 8B shows an electrical potential (voltage) applied between opposed electrodes of each transducer, with the voltage being sufficient to induce electrostatic attraction between the electrodes. The dielectric fluid may be driven out of the volume between the electrodes into portion 870 of the transducer. This portion 870 may be relatively non-stretchable (e.g., less elastic compared with other portions), as a non-stretchable portion may generate higher forces and greater haptic signals. This may provide a haptic signal for the user of the wearable device. The opposed electrodes 830 and 840 may be in a zipped state (indicated at 860) in which electrostatic attraction between the electrodes, or between layer(s) located therebetween, induce close proximity of the electrodes. The region 845 between the electrodes may substantially exclude dielectric fluid. In some examples, the region 845 may include one or more weakly electrically conductive layers configured to induce stronger electrostatic attraction between the layers and either other layers or an electrode.

In some examples, a device may be configured to be located proximate or in contact with a user. The user may exert a force, which may be termed a preload, that modifies the state of the device (e.g., modifies the degree of actuation of an actuator). The preload may add one or more additional factors into determination of the displacement or force based on the applied voltage. Measurement of the capacitance between a pair of opposed electrodes may provide additional information that allows accurate determination of the preload, displacement, and/or force.

In some examples, a sensing and feedback system may include a capacitance sensor configured to determine a capacitance between a pair of electrodes, and an actuator controller configured to apply a voltage between a pair of electrodes. The same pair of electrodes may be used for measuring the capacitance and applying the voltage, though in some examples one or more additional electrodes may be used for capacitance measurement and/or voltage application. In some examples, one or more capacitance measurements may be used to determine a preload on a device. In some examples, capacitance measurement may be used to provide feedback that is then used to adjust the voltage applied to the device to obtain a desired displacement and/or force. In some examples, capacitance measurements may be used to modify the behavior of the device in response to an applied voltage; for example, to obtain a nonlinear force-displacement curve. In some examples, a device may be configured to obtain a nonlinear force-displacement curve that may approximate a haptic version of a mechanical keyboard for a typing input, as further described below.

FIG. 9 shows a possible force-displacement relationship for an example device. This example may correspond to the force-displacement relationship as a finger presses on a tactile zipper actuator. The force initially increases with more pressure (less displacement), and then may suddenly drop to a low value as the zipped part of the actuator unzips. The force-displacement curve can also be controlled using a capacitive force sensing and feedback mechanism such as described above. This form of force feedback may provide a realistic haptic rendering for a mechanical keyboard.

In some examples, the control signal may initially be at a higher value (e.g., a higher voltage) for a contact force up to a threshold force, then decrease to a lower value (e.g., changed to a lower voltage) as the contact force increases in value to above the threshold force.

FIGS. 10A and 10B further illustrate electrostatic attraction between the electrodes of a device, such as a transducer (e.g., an actuator). FIG. 10A shows a device similar to that discussed above in relation to FIG. 2A. The device includes first membrane 1010, second membrane 1020, a dielectric fluid 1005 within an enclosure at least partially defined by the first and second membranes, and electrodes 1030, 1040, 1050, and 1060. Each electrode has a weakly electrically conductive layer disposed on the inner surface of the electrode (e.g., between the electrode and the dielectric fluid in this configuration), such as weakly conductive layer 1065.

FIG. 10B shows the device in a configuration with two zipped portions, shown at 1070 and 1080. Electrostatic attraction between the surfaces of the weakly electrically conductive layers drives the dielectric fluid out of the zipped portions and into a central portion 1090 of the device, which may be expandable due to the elasticity of one or more membranes. This movement of the dielectric fluid may provide a perceptible haptic signal, such as a perceptible tactile sensation for a user, for example, due to the displacement of the membrane within the central portion 1090. The two pairs of electrodes are separated by weakly electrically conductive materials, and a pair of electrostatically attracted (and substantially adjacent) weakly electrically conductive layers may be located between each pair of electrodes. A weakly electrically conductive layer may have an electrical resistivity between approximately $10^{10}$ ohm.cm and approximately $10^{12}$ ohm.cm.

Figure 11B:
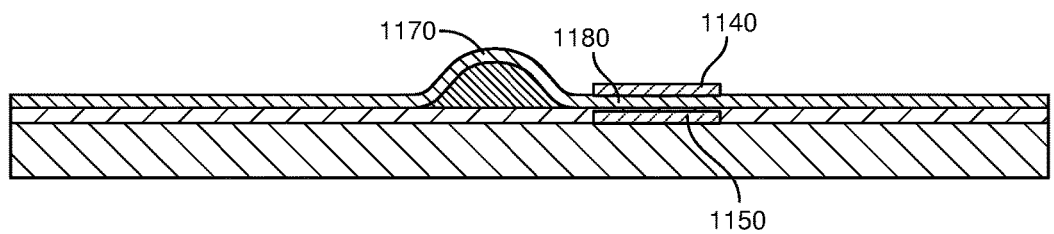

FIGS. 11A and 11B illustrate a further example actuator in cross-section, according to some embodiments. FIG. 11A shows a device 1100 including a first membrane 1110, second membrane 1120, substrate 1130, and electrodes 1140 and 1150. Electrodes 1140 and 1150 could be longer as needed. The first and second membrane may define an enclosure 1102, which may include a dielectric fluid at 1105 and 1108. The remainder of the enclosure may be filled with a gas, such as air. In some examples, a dielectric fluid may fill the enclosure. There may be a second pair of electrodes on the other side of the central portion (not shown for illustrative simplicity), for example, close to dielectric fluid 1108, so that the device behavior may be generally symmetrical about the initial central portion 1160. In some examples, the second pair of electrodes may be omitted.

FIG. 11B shows the device in a zipped state (not to scale), having a zipped portion 1180 in which the electrodes 1140 and 1150 are electrostatically attracted to each other. The dielectric fluid may be expelled from between the electrodes 1140 and 1150 into the zipped state central portion 1170. In this example, the central portion of the device may be pulled in towards the substrate when the device is in the zipped state. This may be facilitated by allowing air within the initial central portion 1160 to escape (e.g., into a gas reservoir or diffuse through the membrane). In some examples, the enclosure is not sealed, and the dielectric fluid may flow out of the enclosure when the device is in the zipped state.

In some examples, FIGS. 11A and 11B may represent a cross-section through a conduit or through a control device (e.g., for controlling flow into, out of, or through a conduit). In the unzipped state, a fluid (such as a gas or liquid) may flow through the enclosure 1102 of the device (as shown in FIG. 11A). The fluid flow may be blocked or otherwise impeded when the device is in the zipped state shown FIG. 11B. Example devices may include fluidic control devices, fluid valves, and the like.

Figure 12:
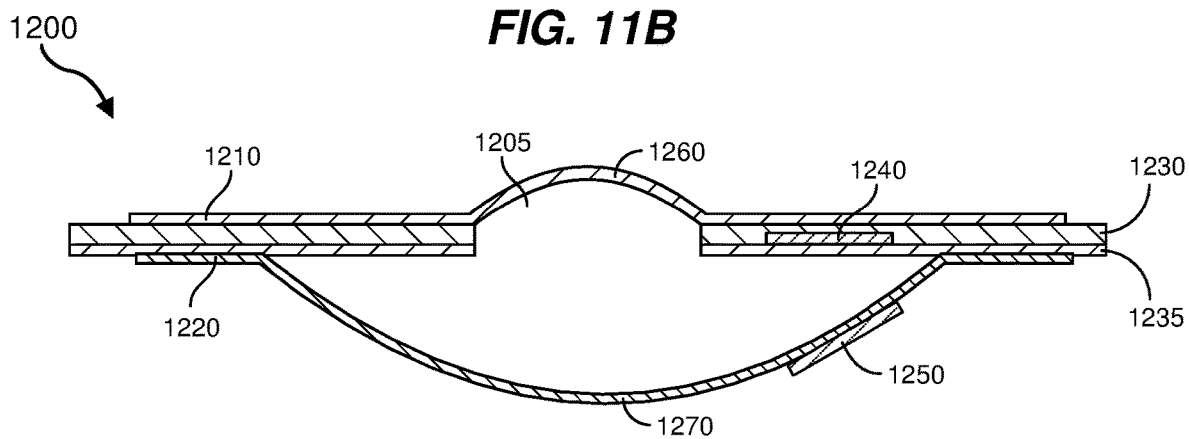
FIG. 12 illustrates another example actuator, according to some embodiments.

FIG. 12 illustrates another example device, according to some embodiments. The device 1200, which may be an actuator, includes first membrane 1210, second membrane 1220, substrate 1230, first electrode 1240, and second electrode 1250. The substrate 1230 is shown having an optional lower substrate coating 1235. In some examples, the electrode 1250 may be flexible and may fully conform to any curvature of the second membrane 1220. In some examples, the electrode may impart additional rigidity to the second membrane 1220 and locally reduce the curvature of the second membrane. The figure shows an example device configuration with no electric potential applied between electrodes 1240 and 1250. In some examples, there may be a second pair of electrodes in a generally symmetrical location on the left hand side of the device as illustrated.

In example devices, electrodes may be covered by a dielectric material, and may be located between layers of a membrane. In some examples, an electrode may be coated by a dielectric layer. In some examples, a device may include electrodes that extend over a greater or lesser extent to those electrodes shown in FIG. 12.

In some examples, negative and positive electrical potentials may be applied to the first and second electrodes (respectively, or vice-versa), inducing electrostatic attraction between the electrodes. In some examples, this may be used to drive actuation, for example, of a haptic device. Electrostatic attraction between the electrodes may be used to drive a dielectric fluid (within enclosure 1205) from between electrodes 1240 and 1250, and into the central area of the device, between membrane portions 1260 and 1270.

In some examples, a device similar to FIG. 12 may be used as an adjustable fluid lens. The enclosure 1205 between the membranes may be filled with a fluid, such as a high refractive index liquid. In this context, a high refractive index liquid may have a refractive index greater than that of water for comparable ambient conditions and wavelengths. In some examples, an enclosure may be only partially filled with a dielectric fluid, such as discussed above in relation to FIG. 11A.

FIG. 12 may represent a cross-section through a channel, or through a generally circular device. In some examples, a similar approach may be used to control fluid flow. FIG. 12 may represent a cross-section through a fluid channel, with the local channel cross-section represented by the area of the enclosure 1205. Electrostatic attraction between the electrodes may be used to reduce the cross-sectional area of the enclosure 1205, and this may be used to narrow the fluid channel and reduce fluid flow rate through the channel. The maximum membrane vertical displacements from horizontal (within membrane portions 1260 and 1270) may be determined by one or more parameters such as the inner pressure of fluid within the enclosure, membrane rigidity, and electrostatic attraction between the electrodes.

Figure 13A:
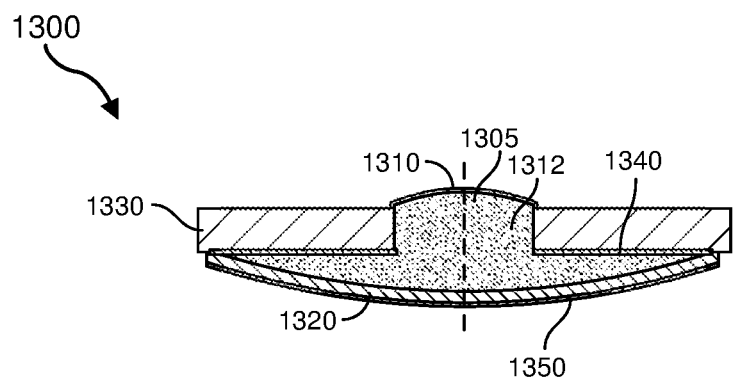
FIGS. 13A-13B and FIGS. 14A-14B illustrate further actuator examples, according to some embodiments.

FIGS. 13A-13D illustrate further examples of a device, according to some embodiments. FIG. 13A shows a device 1300 including a first membrane 1310, second membrane 1320, substrate 1330, and electrodes 1340 and 1350. The membranes and substrate may cooperatively define an enclosure 1305, which in some examples may enclose a dielectric fluid. The substrate 1330 may have a central aperture 1312. In some examples, the electrode 1340 may have an annular form so that the electrode encircles a central aperture 1312 within the substrate. The electrode 1350 may extend over the second membrane 1320. The figure may represent a cross-section through a generally circular device.

Example devices configured as shown in FIGS. 13A-13D may include electrically controllable haptic devices, electrically controllable optical devices, or adjustable conduit devices with electrically controllable fluid flow. In some examples, the membranes 1310 and 1320 may have a curved profile so that the device may function as an optical element, such as a lens (a biconcave lens in the illustrated example). In other examples, a device may be a plano-concave (e.g., having only one flexible membrane), or may have one or more concave surfaces. One or more of the substrate, membranes, and/or electrodes may be generally transparent (e.g., over at least a range of visible or infrared (IR) wavelengths).

Figure 13B:
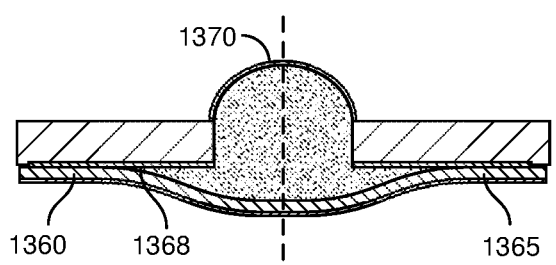

FIG. 13B illustrates that electrostatic attraction between the electrodes may lead to a zipped state (e.g., as shown at 1360 and 1365). A zipped state may occur where there is electrostatic attraction between the electrodes, or between an electrode and a dielectric layer associated with the other electrode. In some examples, the membrane 1320 may be include a weakly electrically conductive material. As the electrostatic attraction between the electrodes is increased, the zipped state may initiate within peripheral portions of the device where the electrodes are closest together, and then propagate inwards as the voltage between the electrodes increases. The location of the zipped state boundary 1368 (between zipped and unzipped states) may be controllable using the degree of electrostatic attraction between the electrode. As the electrostatic attraction between the electrodes increases, the zipped state boundary 1368 may move towards the center of the device, displacing dielectric fluid towards the center of the device, and causing the membrane center 1370 to extend outwardly. In a lens configuration, this may increase the optical power of the lens. In a haptic device configuration, the displacement of the membrane at 1370 may be perceptible by a device used.

Figure 14A:
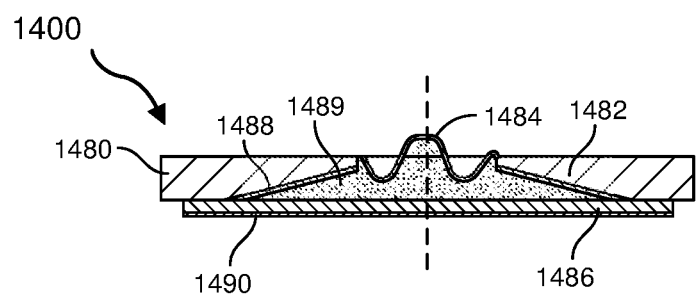
Figure 14B:
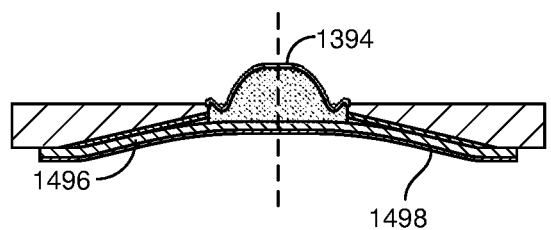

FIGS. 14A and 14B show a similar device configuration as FIGS. 13A and 13B. In this example, the device 1400 includes a substrate 1480 that has a inwardly tapered portion 1482 having a thickness that diminishes with distance towards the device center (indicated by the dashed vertical line). The device includes a first membrane 1484, a second membrane 1486, and electrodes 1488 and 1490. The substrate and membranes cooperatively define, at least in part, an enclosure 1489. The first membrane 1484 may have an initial non-planar form. In this example, the first membrane 1484 may be molded or otherwise preformed to have a ridged profile. A membrane profile including one or more ridges, or having a variable curvature, may be used to provide a different perceptible tactile sensation.

FIG. 14B shows the device including a zipped configuration in which there is electrostatic attraction between the electrodes. Zipped portions are shown at 1496 and 1498.

Dielectric fluid may be expelled from between the zipped electrodes, expanding the first membrane outwards, away from the substrate, at 1492. The increased pressure within the enclosure 1489 may tend to remove the ridges from the profile of membrane 1484. This may lead to a different perceived texture of the membrane, which may be used to provide haptic feedback to a user.

An example actuator, according to some embodiments, may include a membrane and electrodes. The membrane and electrodes may cooperatively define an enclosure. The enclosure may be at least partially filled with a fluid dielectric, such as a liquid dielectric. As the electrodes are electrostatically attracted to each other, the liquid dielectric may start to fill the space between the electrodes, and then may be expelled from between the electrodes into a central portion of the enclosure. The membrane and/or electrodes may include a flexible material.

In some examples, one or both membranes of an example device may be omitted, and the function of the membrane may be provided by a flexible electrode.

In some examples, electrodes may be transparent, optically absorbing at one or more wavelengths, reflective, or diffractive (e.g., for a visually interesting appearance). Electrodes may include one or more electrically conductive materials, such as one or more of a metal, an electrically conductive metal oxide (e.g., indium tin oxide, tin oxide, and other conductive oxides), electrically conductive polymers (e.g., polymers having appreciable electron delocalization, ionic polymers, doped polymers, and blends or derivatives thereof), or other electrically conductive material. In some examples, an electrode may be a thin film having a thickness between 1 micron and 2 mm, such as between 10 microns and 1 mm.

In some examples, a membrane may be an elastic membrane. A membrane may include one or more polymers. In some examples, a membrane may include one or more of a silicone polymer (e.g., polydimethylsiloxane, PDMS), a urethane polymer (e.g., a thermoplastic polyurethane, TPU), a polyethylene, a polybutylene, a polypropylene, an acrylate polymer (e.g., a methacrylate polymer such as polymethyl methacrylate), a gel (e.g., a hydrogel), a fluoropolymer, or an electrically conductive polymer.

In some examples, a weakly electrically conductive layer may include one or more of a polymer, a semiconductor polymer, an inorganic semiconductor layer, a doped material (e.g., a doped semiconductor or polymer, with relatively low dopant concentrations to avoid high electrical conductivity), or other material having a desired electrical conductivity. In some examples, the weakly electrically conductive layer may be porous and/or include a network or other arrangement of nanoparticles, nanofibers, or other internal structure.

In some examples, a dielectric fluid may include a polar liquid, such as one or more of a dipolar molecule (e.g., a haloalkane or other halogenated or other dipolar group containing molecule), a silicon-containing liquid (e.g., a silicone oil), or other fluid (e.g., a dielectric liquid) as known in the art.

The capacitance between an opposed pair of electrodes within the device may be termed a device capacitance. There may be one or more device capacitances measurable for a device or a transducer therein, depending on the number and arrangement of electrodes. In some examples, a capacitance sensor may include a signal source generating an alternating signal, allowing the impedance of the capacitor formed by the electrodes to be determined for the known signal frequency, and hence the device capacitance to be determined. A capacitance sensor may also include a timing circuit that uses the device capacitance to influence a measured time period or frequency, or may include a bridge circuit (e.g., including a known capacitance), allowing the device capacitance to be determined. In some examples, a weakly electrically conductive layer may have a negligible effect on the determined device capacitance.

Examples also include methods of operating a device, such as an actuator and/or sensor that may include at least one membrane, such as a thin flexible membrane. In some examples, a method may include adjusting an electric potential applied between a pair of electrodes using a controller to obtain a displacement and/or contact force (e.g., of at least a portion of the device, such as at least a portion of the membrane), and determining a capacitance between the pair of electrodes to determine the displacement and/or contact force. In some examples, the electrical potential may be adjusted based on the capacitance measurement. In some examples, the displacement determined based on the capacitance measurement may be compared with a desired displacement, and the controller may be modified to reduce the difference between the determined deformation and the desired deformation. In some examples, the degree of actuation may be determined by the electrical potential and an external force acting on the device (e.g., pushing against the membrane). Since the electrical potential may be known (being controlled by the controller), and the displacement may be determined based on the capacitance measurements, the controller may be configured to determine the external force acting on the device based on the electrical potential and the capacitance measurements (and/or other parameters derived therefrom).

In some examples, a controller may be configured to adjust an electric potential applied between a pair of electrodes, and the electrical potential may include a direct component and/or an alternating component. In some examples, a direct component may be adjusted to modify an actuator or sensor (e.g., modify the displacement of a membrane or portion thereof). In some examples, different signal frequencies may be used for capacitance measurements and for device control.

In some examples, a method may include modifying the electric potential based on the displacement, such as a displacement of a membrane determined based on a capacitance measurement. For example, the controller may dynamically modify a force-displacement property of the device. For example, a membrane of the device may provide an initial resistance to an external force for displacements less than a predetermined threshold displacement (e.g., for approximately zero or relatively small displacements), and a subsequent resistance to an external force for displacements greater than a predetermined threshold. The resistance (e.g., a force resisting displacement of the membrane) may be adjusted using the electrical potential, for example, by lowering the electrical potential after the threshold displacement is exceeded.

FIG. 15 illustrates an example method of operating a device, such as an actuator and/or sensor. The method 1500 includes applying an electric potential between a pair of electrodes (1510) to induce a deformation of the device, measuring a capacitance between the pair of electrodes to determine the deformation and/or contact force of the device (1520), and modifying the electric potential based on the capacitance measurement to obtain a desired deformation (1530).

In some examples, a body part (such as a finger) may apply a contact force to the device, a capacitance is measured between a pair of electrodes, and both deformation and contact force may be determined from the capacitance measurement. Various control strategies may be used based on the capacitance measurement, such as force feedback driven actuation. In some examples, when the contact force exceeds a certain threshold force, the actuator may be turned off rapidly to simulate a button click. A person may push on the membrane with an increasing contact force, and the resistance to deformation may reduce after the contact force becomes greater than a threshold value. For example, the voltage between the electrodes may be reduced to zero, approximately zero, or other reduced value when the contact force exceeds the threshold value.

In some examples, the deformation may include a modification of a zipped area of the device. The zipped area may correspond to an area in which the electrodes are electrostatically attracted to each other so as to expel a dielectric fluid from between the electrodes.

FIG. 16 illustrates a further example method 1600 of operating a device, such as an actuator and/or sensor. The method includes applying an electric potential between a pair of electrodes to induce electrostatic attraction between the electrodes (e.g., within at least a portion of the electrodes) (1610), measuring a capacitance between the pair of electrodes to determine a zipped area (1620), the area over which the electrodes are in an electrostatically attracted state, and modifying the electric potential (e.g., based on the capacitance measurement) to adjust the zipped area (1630). The electrostatically attracted state, which may also be referred to as a zipped state, may include at least a portion the pair of electrodes separated by one or more weakly electrically conductive layers. An example device may have an enclosure including a dielectric fluid, and the dielectric fluid may be driven out of the portion of the enclosure located between the electrodes when the electrodes are in a zipped state.

FIGS. 15 and 16 may represent exemplary computer-implemented methods. Voltage control and capacitance measurements may be made based on signals from a controller. The steps shown in FIGS. 15 and 16 may be performed by any suitable computer-executable code and/or computing system. In some examples, one or more method steps may represent an algorithm whose structure includes and/or is represented by multiple sub-steps. In some examples, a device may include a controller that includes at least one physical processor, and physical memory including computer-executable instructions that, when executed by the physical processor, cause the physical processor to perform a method such as described herein. In some examples, a non-transitory computer-readable medium may include one or more computer-executable instructions that, when executed by at least one processor of a computing device, cause the computing device to perform a method such as described herein.

FIG. 17 illustrates an example method (1700) of fabricating an actuator. The method includes forming an electrode on (e.g., supported by) a membrane (1710), forming a weakly electrically conductive layer on the electrode (1720), and fabricating a device including the electrode, the membrane, the weakly electrically conductive layer (1730), and optionally a second electrode, whereby an electric potential can be applied between the electrode and second electrode to induce deformation of the membrane and/or electrostatic attraction between the weakly electrically conductive layer and the second electrode (or a layer formed on the second electrode). In some examples, the weakly conductive layer may have a high dielectric constant. In this context, a high dielectric constant may be appreciably greater than 1, such as greater than 2, at a relevant frequency (e.g., at the frequency of a signal applied between the electrodes). Weakly conductive layers may be formed on the inside surfaces of one or both of the electrodes of a pair of electrodes.

In some examples, capacitive sensing approaches described herein may be used in other devices, including optical devices such as liquid lenses. In an example optical device, a capacitive sensor may be used to monitor an optical property of the optical device, such as optical power, and the sensor signal may be used to adjust control of the optical device. The controller may be configured to determine the optical power of a liquid lens based on the capacitance between a pair of electrodes, such as one electrode supported by a flexible membrane and another electrode supported by a relatively rigid substrate. In some examples, an adjustable liquid lens may include a capacitive sensor responsive to the optical power of the lens. In example liquid lenses, the electrode architecture may include one or both of parallel plate and co-planar configurations. For example, a substrate may include a pair of electrodes, and the capacitance between the electrodes may vary with optical power due to variations in the extent of the dielectric medium located between the electrodes.

In some examples, a membrane may include, at least in part, a weakly electrically conductive material. A weakly electrically conductive material may have a bulk resistivity between $~10^{10}$ ohm.cm and $~10^{12}$ ohm.cm. In some examples, the electric potential applied between the electrodes may induce an electrical polarization within one or more layers located between the electrodes (e.g., within a portion of a membrane and/or within a weakly electrically conductive layer). The induced electrical polarization may result in a Johnsen-Rahbek effect, such as an electrostatic attraction between one or more electrodes and/or layers disposed therebetween. Electrostatic attractive forces, such as electrostatic forces due to the Johnsen-Rahbek effect, may allow device operation at lower voltages or offer an increased pressure for a particular voltage. In some examples, a device may have an increased membrane thickness (e.g., for improved robustness) without needing higher voltages due to an electrostatic attraction between a pair of electrodes and/or any intervening layer(s). In some examples, a direct voltage control signal may be used as an alternative to (or in addition to) an alternating voltage control signal. The use of a control signal using a direct voltage may allow control circuit simplification, and/or may facilitate application of a control signal during capacitance measurements using an alternating voltage. A controller may determine a voltage of a control signal based on an rms voltage value for a control signal that may include direct and/or alternating components. In some examples, a weakly electrically conductive membrane may cover at least the inner surface of one or more electrodes. The inner surface of an electrode may face an enclosure between the membranes (and/or the electrodes), and may face the dielectric liquid.

In some examples, a capacitive sensor may be integrated with a device (e.g., an electrostatic or piezoelectric haptic actuator) to provide real-time feedback and dynamic control of the device. Example devices may include a pair of opposed electrodes separated by a dielectric fluid, with one or more electrodes supported by a deformable membrane. In a zipped tactile actuator, for example, a measurable capacitance may be proportional to the zipped area between the electrodes, in which a dielectric fluid may be excluded by electrostatic attraction between the electrodes. The membrane shape, such as the curvature and/or the displacement of at least a portion of the membrane, may be modified by adjusting the electric potential between a pair of electrodes, one of which may be located on the membrane. The measured capacitance may be used to determine the membrane shape (such as a displacement output of the device) and/or a force applied to the membrane by a user.

The degree of actuation may be (or include) a displacement of at least a portion of a membrane. In some examples, a comparison of a measured degree of actuation and an intended degree of actuation may allow the controller to be adjusted so that the actual degree of actuation (e.g., membrane displacement or contact force) obtained for a particular control voltage is closer to the intended degree of actuation. For example, a controller may be adjusted by modification of a lookup table.

In some examples, a device may include a first membrane supporting a first electrode, and a generally opposed second electrode that may be supported by a second membrane, or, in some examples, on a rigid substrate. The device may have a zipped state in which the electrodes are electrostatically attracted together, and the dielectric fluid may be substantially excluded from an enclosure volume located between the electrodes. The enclosure may be defined, at least in part, by the membrane(s) and/or substrate, and the enclosure volume may be fixed so that a zipped state between the electrodes may urge the dielectric fluid into an expandable portion of the device. The zipped state may correspond to the electrodes being as close together as physically possible in normal operating conditions. The electrodes may be separated by one or more intervening layers (such as one or more membranes, or portions thereof, or one or more weakly electrically conductive layers). The device may have a zipped area, which may correspond to an area of the device in which the zipped state is achieved and the electrodes are electrostatically attracted together. The zipped area for a particular electrode may be adjusted by varying the electrical potential and by varying an external pressure on the device, and may be determined by one or more capacitance measurements, for example, between one or more pairs of electrodes.

In some aspects, a measured capacitance in conjunction with a known driving voltage may be used to calculate a net displacement value of a deformable membrane and/or contact force. The displacement value may be incorporated into a feedback signal usable to control the displacement as well as an output pressure and thereby desirably impact a user's interaction with a system that includes the actuator. In some embodiments, a DC voltage may be applied to one of the electrodes to tune the dynamic range of the capacitance measurement. For example, in a force sensing mode, a DC voltage may be applied to maintain the zipping actuator in a zipped or a substantially zipped state in order to produce a large capacitance where small changes in an external applied force may result in large changes in capacitance. Such a configuration may advantageously improve a signal-to-noise ratio in the feedback loop.

In some examples, the required voltage used to drive a haptic actuator may be decreased in accordance with the Johnsen-Rahbek effect by replacing at least a portion of a dielectric membrane (e.g., the deformable membrane) with a weakly electrically conductive membrane (e.g., a bulk resistivity in the approximate range of between $~10^{10}$ ohm.cm and $~10^{12}$ ohm.cm). The added conductivity may also provide the benefit of dissipating static charges. A weakly electrically conductive layer (e.g., a membrane or portion thereof) may be located between the inner surface of an electrode and the dielectric fluid. In addition to, or in lieu of, sensing/feedback to enable control of a haptic actuator, capacitive feedback may be used to generate a force-displacement curve to support implementation of further devices, such as a haptic version of a mechanical keyboard that provides the user with the sensory experience of typing.

Capacitive sensing may be used in various device examples, including optical devices such as liquid lenses where capacitive feedback may be used to monitor and control the optical power of the lens. In example liquid lenses, the electrode arrangement may include both parallel plate and co-planar configurations (e.g., electrodes on the same substrate or membrane). Hence, capacitive sensing may be used to monitor and adjust the operation of various devices, such as transducers such as actuators and/or sensors.

In some examples, a device may include a membrane (e.g., a flexible membrane), an electrode supported by the membrane, a second electrode, a capacitance sensor configured to determine a capacitance measurement between the first electrode and the second electrode, and a controller configured to control an electrical potential applied between the first electrode and the second electrode. The controller may be configured to modify the electrical potential based on the capacitance measurement. Example devices may include one or more flexible membranes that may, at least in part, define an enclosure that is at least partially filled with a dielectric fluid. Devices may have a zipped state, in which electrodes are electrostatically attracted together and intervening dielectric fluid is substantially excluded from between the electrodes. Examples also include associated methods and systems.

EXAMPLE EMBODIMENTS

Example 1: An example device may include a membrane, a first electrode supported by the membrane, a second electrode, a sensor configured to measure a capacitance between the first electrode and the second electrode, and a controller configured to control, based on the capacitance measured by the sensor, an electrical potential applied between the first electrode and the second electrode.

Example 2. The device of example 1, wherein the electrical potential induces a movement of the first electrode towards the second electrode.

Example 3. The device of examples 1 or 2, further including an enclosure that is at least partially filled with a dielectric fluid, wherein the movement of the first electrode towards the second electrode excludes a portion of the dielectric fluid from between the first electrode and the second electrode.

Example 4. The device of any of examples 1-3, wherein the capacitance is responsive to an area of the device in which the portion of the dielectric fluid is displaced from between the first electrode and the second electrode.

Example 5. The device of any of examples 1-4, wherein the device includes an actuator, and the electric potential induces a displacement of at least a portion of the actuator.

Example 6. The device of example 5, wherein the controller is configured to determine the displacement based on the capacitance.

Example 7. The device of any of examples 1-6, wherein the device is a wearable device.

Example 8. The device of any of examples 1-7, wherein the device is a haptic device to be worn by a user, and the device is configured to provide a perceptible tactile sensation to the user in response to the electrical potential when the device is worn by the user.

Example 9. The device of any of examples 7, wherein the device includes a wristband or a glove.

Example 10. The device of any of examples 1-9, wherein the first electrode has an inner surface, with the inner surface facing the second electrode, and the device further includes a weakly electrically conductive layer disposed on the inner surface of the first electrode.

Example 11. The device of example 10, wherein the weakly electrically conductive layer has a resistivity of between $10^{10}$ ohm.cm and $10^{12}$ ohm.cm.

Example 12. The device of examples 10 or 11, wherein the electrical potential induces an electrical polarization in the weakly electrically conductive layer.

Example 13. The device of example 12, wherein the electrical polarization induces an electrostatic attraction between the weakly electrically conductive layer and the second electrode or a layer thereon.

Example 14. The device of examples 12 or 13, wherein the device further includes a second weakly electrically conductive layer disposed on the second electrode, and the electrical polarization induces an electrostatic attraction between the weakly electrically conductive layer and the second weakly electrically conductive layer.

Example 15. The device of any of examples 1-14, wherein the controller is further configured to determine an external applied force exerted on the membrane based on the capacitance.

Example 16. The device of any of examples 1-15, wherein the controller is further configured to determine a preload on the device based on the external applied force, and modify the electrical potential based on the preload.

Example 17. An example method may include applying an electric potential between a first electrode and a second electrode of a device including a membrane to induce a displacement of the membrane wherein the first electrode is disposed on the membrane, measuring a capacitance between the first electrode and the second electrode to determine the displacement of the membrane, and modifying the electric potential based on the capacitance.

Example 18. The method of example 17, wherein the device is an actuator, and the actuator is configured to provide a haptic signal.

Example 19. An example method may include applying an electric potential between electrodes separated by a dielectric fluid to induce electrostatic attraction between the electrodes and formation of a zipped state in which the dielectric fluid is excluded from between the electrodes, measuring a capacitance between the electrodes to determine an area of the zipped state, and modifying the electric potential to adjust the area of the zipped state.

Example 20. The method of example 19, wherein the method includes controlling an actuator, the actuator including a membrane having a displacement based on the area of the zipped state.

Embodiments of the present disclosure may include or be implemented in conjunction with various types of artificial reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs). Other artificial reality systems may include an NED that also provides visibility into the real world (such as, e.g., augmented-reality system 1800 in FIG. 18) or that visually immerses a user in an artificial reality (such as, e.g., virtual-reality system 1900 in FIG. 19). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 18:
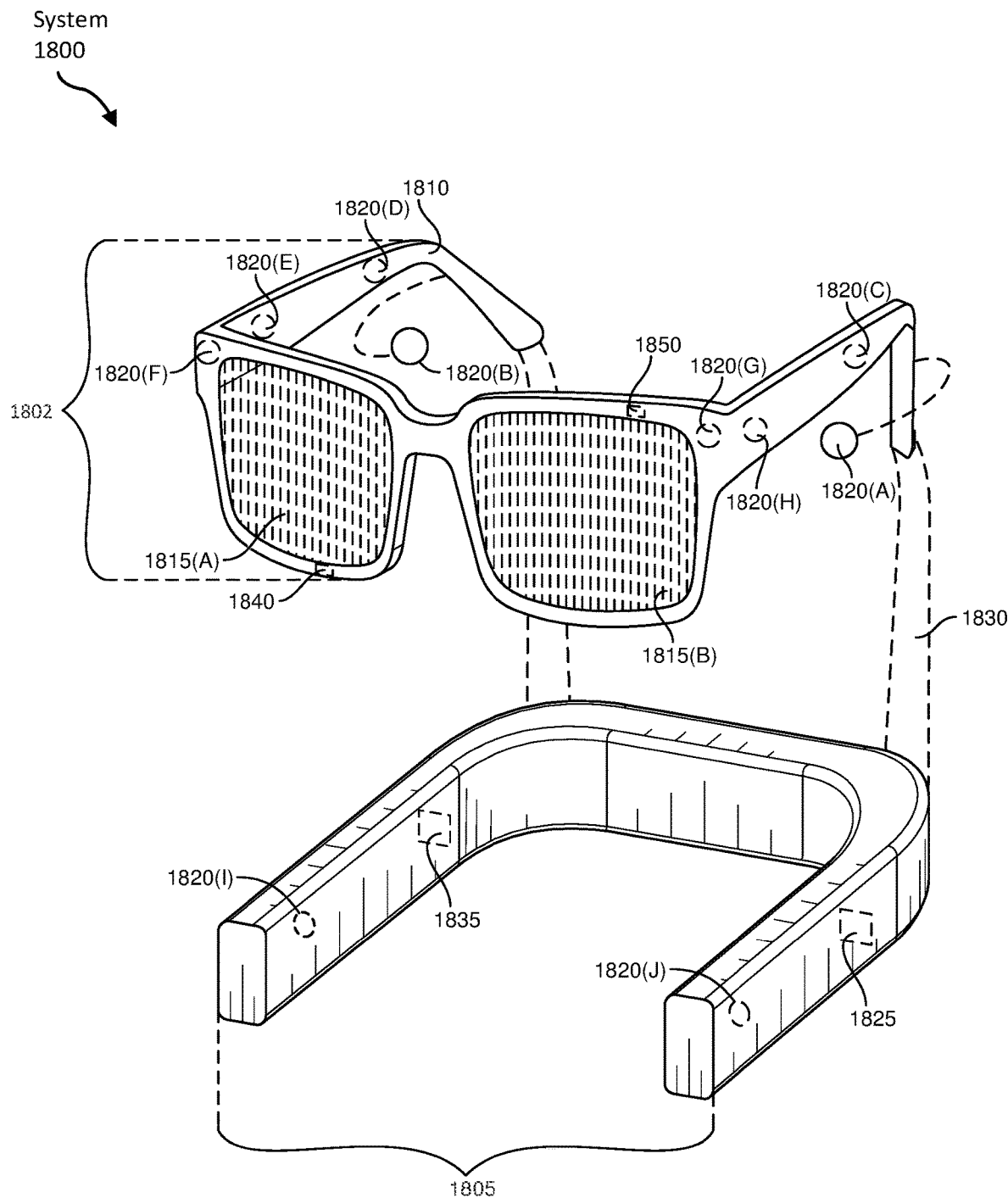
FIG. 18 is an illustration of exemplary augmented-reality glasses that may be used in connection with embodiments of this disclosure.

Turning to FIG. 18, augmented-reality system 1800 may include an eyewear device 1802 with a frame 1810 configured to hold a left display device 1815(A) and a right display device 1815(B) in front of a user's eyes. Display devices 1815(A) and 1815(B) may act together or independently to present an image or series of images to a user. While augmented-reality system 1800 includes two displays, embodiments of this disclosure may be implemented in augmented-reality systems with a single NED or more than two NEDs.

In some embodiments, augmented-reality system 1800 may include one or more sensors, such as sensor 1840. Sensor 1840 may generate measurement signals in response to motion of augmented-reality system 1800 and may be located on substantially any portion of frame 1810. Sensor 1840 may represent one or more of a variety of different sensing mechanisms, such as a position sensor, an inertial measurement unit (IMU), a depth camera assembly, a structured light emitter and/or detector, or any combination thereof. In some embodiments, augmented-reality system 1800 may or may not include sensor 1840 or may include more than one sensor. In embodiments in which sensor 1840 includes an IMU, the IMU may generate calibration data based on measurement signals from sensor 1840. Examples of sensor 1840 may include, without limitation, accelerometers, gyroscopes, magnetometers, other suitable types of sensors that detect motion, sensors used for error correction of the IMU, or some combination thereof.

In some examples, augmented-reality system 1800 may also include a microphone array with a plurality of acoustic transducers 1820(A)-1820(J), referred to collectively as acoustic transducers 1820. Acoustic transducers 1820 may represent transducers that detect air pressure variations induced by sound waves. Each acoustic transducer 1820 may be configured to detect sound and convert the detected sound into an electronic format (e.g., an analog or digital format). The microphone array in FIG. 18 may include, for example, ten acoustic transducers: 1820(A) and 1820(B), which may be designed to be placed inside a corresponding ear of the user, acoustic transducers 1820(C), 1820(D), 1820(E), 1820(F), 1820(G), and 1820(H), which may be positioned at various locations on frame 1810, and/or acoustic transducers 1820(I) and 1820(J), which may be positioned on a corresponding neckband 1805.

In some embodiments, one or more of acoustic transducers 1820(A)-(J) may be used as output transducers (e.g., speakers). For example, acoustic transducers 1820(A) and/or 1820(B) may be earbuds or any other suitable type of headphone or speaker.

The configuration of acoustic transducers 1820 of the microphone array may vary. While augmented-reality system 1800 is shown in FIG. 18 as having ten acoustic transducers 1820, the number of acoustic transducers 1820 may be greater or less than ten. In some embodiments, using higher numbers of acoustic transducers 1820 may increase the amount of audio information collected and/or the sensitivity and accuracy of the audio information. In contrast, using a lower number of acoustic transducers 1820 may decrease the computing power required by an associated controller 1850 to process the collected audio information. In addition, the position of each acoustic transducer 1820 of the microphone array may vary. For example, the position of an acoustic transducer 1820 may include a defined position on the user, a defined coordinate on frame 1810, an orientation associated with each acoustic transducer 1820, or some combination thereof.

Acoustic transducers 1820(A) and 1820(B) may be positioned on different parts of the user's ear, such as behind the pinna, behind the tragus, and/or within the auricle or fossa. Or, there may be additional acoustic transducers 1820 on or surrounding the ear in addition to acoustic transducers 1820 inside the ear canal. Having an acoustic transducer 1820 positioned next to an ear canal of a user may enable the microphone array to collect information on how sounds arrive at the ear canal. By positioning at least two of acoustic transducers 1820 on either side of a user's head (e.g., as binaural microphones), augmented-reality device 1800 may simulate binaural hearing and capture a 3D stereo sound field around about a user's head. In some embodiments, acoustic transducers 1820(A) and 1820(B) may be connected to augmented-reality system 1800 via a wired connection 1830, and in other embodiments acoustic transducers 1820(A) and 1820(B) may be connected to augmented-reality system 1800 via a wireless connection (e.g., a BLUETOOTH connection). In still other embodiments, acoustic transducers 1820(A) and 1820(B) may not be used at all in conjunction with augmented-reality system 1800.

Acoustic transducers 1820 on frame 1810 may be positioned in a variety of different ways, including along the length of the temples, across the bridge, above or below display devices 1815(A) and 1815(B), or some combination thereof. Acoustic transducers 1820 may also be oriented such that the microphone array is able to detect sounds in a wide range of directions surrounding the user wearing the augmented-reality system 1800. In some embodiments, an optimization process may be performed during manufacturing of augmented-reality system 1800 to determine relative positioning of each acoustic transducer 1820 in the microphone array.

In some examples, augmented-reality system 1800 may include or be connected to an external device (e.g., a paired device), such as neckband 1805. Neckband 1805 generally represents any type or form of paired device. Thus, the following discussion of neckband 1805 may also apply to various other paired devices, such as charging cases, smart watches, smart phones, wrist bands, other wearable devices, hand-held controllers, tablet computers, laptop computers, other external compute devices, etc.

As shown, neckband 1805 may be coupled to eyewear device 1802 via one or more connectors. The connectors may be wired or wireless and may include electrical and/or non-electrical (e.g., structural) components. In some cases, eyewear device 1802 and neckband 1805 may operate independently without any wired or wireless connection between them. While FIG. 18 illustrates the components of eyewear device 1802 and neckband 1805 in example locations on eyewear device 1802 and neckband 1805, the components may be located elsewhere and/or distributed differently on eyewear device 1802 and/or neckband 1805. In some embodiments, the components of eyewear device 1802 and neckband 1805 may be located on one or more additional peripheral devices paired with eyewear device 1802, neckband 1805, or some combination thereof.

Pairing external devices, such as neckband 1805, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1800 may be provided by a paired device or shared between a paired device and an eyewear device, thus reducing the weight, heat profile, and form factor of the eyewear device overall while still retaining desired functionality. For example, neckband 1805 may allow components that would otherwise be included on an eyewear device to be included in neckband 1805 since users may tolerate a heavier weight load on their shoulders than they would tolerate on their heads. Neckband 1805 may also have a larger surface area over which to diffuse and disperse heat to the ambient environment. Thus, neckband 1805 may allow for greater battery and computation capacity than might otherwise have been possible on a stand-alone eyewear device. Since weight carried in neckband 1805 may be less invasive to a user than weight carried in eyewear device 1802, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 1805 may be communicatively coupled with eyewear device 1802 and/or to other devices. These other devices may provide certain functions (e.g., tracking, localizing, depth mapping, processing, storage, etc.) to augmented-reality system 1800. In the embodiment of FIG. 18, neckband 1805 may include two acoustic transducers (e.g., 1820(I) and 1820(J)) that are part of the microphone array (or potentially form their own microphone subarray). Neckband 1805 may also include a controller 1825 and a power source 1835.

Acoustic transducers 1820(I) and 1820(J) of neckband 1805 may be configured to detect sound and convert the detected sound into an electronic format (analog or digital). In the embodiment of FIG. 18, acoustic transducers 1820(I) and 1820(J) may be positioned on neckband 1805, thereby increasing the distance between the neckband acoustic transducers 1820(I) and 1820(J) and other acoustic transducers 1820 positioned on eyewear device 1802. In some cases, increasing the distance between acoustic transducers 1820 of the microphone array may improve the accuracy of beamforming performed via the microphone array. For example, if a sound is detected by acoustic transducers 1820(C) and 1820(D) and the distance between acoustic transducers 1820(C) and 1820(D) is greater than, for example, the distance between acoustic transducers 1820(D) and 1820(E), the determined source location of the detected sound may be more accurate than if the sound had been detected by acoustic transducers 1820(D) and 1820(E).

Controller 1825 of neckband 1805 may process information generated by the sensors on neckband 1805 and/or augmented-reality system 1800. For example, controller 1825 may process information from the microphone array that describes sounds detected by the microphone array. For each detected sound, controller 1825 may perform a direction-of-arrival (DOA) estimation to estimate a direction from which the detected sound arrived at the microphone array. As the microphone array detects sounds, controller 1825 may populate an audio data set with the information. In embodiments in which augmented-reality system 1800 includes an inertial measurement unit, controller 1825 may compute all inertial and spatial calculations from the IMU located on eyewear device 1802. A connector may convey information between augmented-reality system 1800 and neckband 1805 and between augmented-reality system 1800 and controller 1825. The information may be in the form of optical data, electrical data, wireless data, or any other transmittable data form. Moving the processing of information generated by augmented-reality system 1800 to neckband 1805 may reduce weight and heat in eyewear device 1802, making it more comfortable to the user.

Power source 1835 in neckband 1805 may provide power to eyewear device 1802 and/or to neckband 1805. Power source 1835 may include, without limitation, lithium ion batteries, lithium-polymer batteries, primary lithium batteries, alkaline batteries, or any other form of power storage. In some cases, power source 1835 may be a wired power source. Including power source 1835 on neckband 1805 instead of on eyewear device 1802 may help better distribute the weight and heat generated by power source 1835.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1900 in FIG. 19, that mostly or completely covers a user's field of view. Virtual-reality system 1900 may include a front rigid body 1902 and a band 1904 shaped to fit around a user's head. Virtual-reality system 1900 may also include output audio transducers 1906(A) and 1906(B). Furthermore, while not shown in FIG. 19, front rigid body 1902 may include one or more electronic elements, including one or more electronic displays, one or more inertial measurement units (IMUS), one or more tracking emitters or detectors, and/or any other suitable device or system for creating an artificial-reality experience.

Artificial reality systems may include a variety of types of visual feedback mechanisms. For example, display devices in augmented-reality system 1800 and/or virtual-reality system 1900 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial reality systems may include a single display screen for both eyes or may provide a display screen for each eye, which may allow for additional flexibility for varifocal adjustments or for correcting a user's refractive error. Some of these artificial reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial reality systems described herein may include one or more projection systems. For example, display devices in augmented-reality system 1800 and/or virtual-reality system 1900 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial reality systems may also be configured with any other suitable type or form of image projection system, such as retinal projectors used in virtual retina displays.

The artificial reality systems described herein may also include various types of computer vision components and subsystems. For example, augmented-reality system 1800 and/or virtual-reality system 1900 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

The artificial reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial reality experience in one or more of these contexts and environments and/or in other contexts and environments.

As noted, artificial reality systems 1800 and 1900 may be used with a variety of other types of devices to provide a more compelling artificial reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 20:
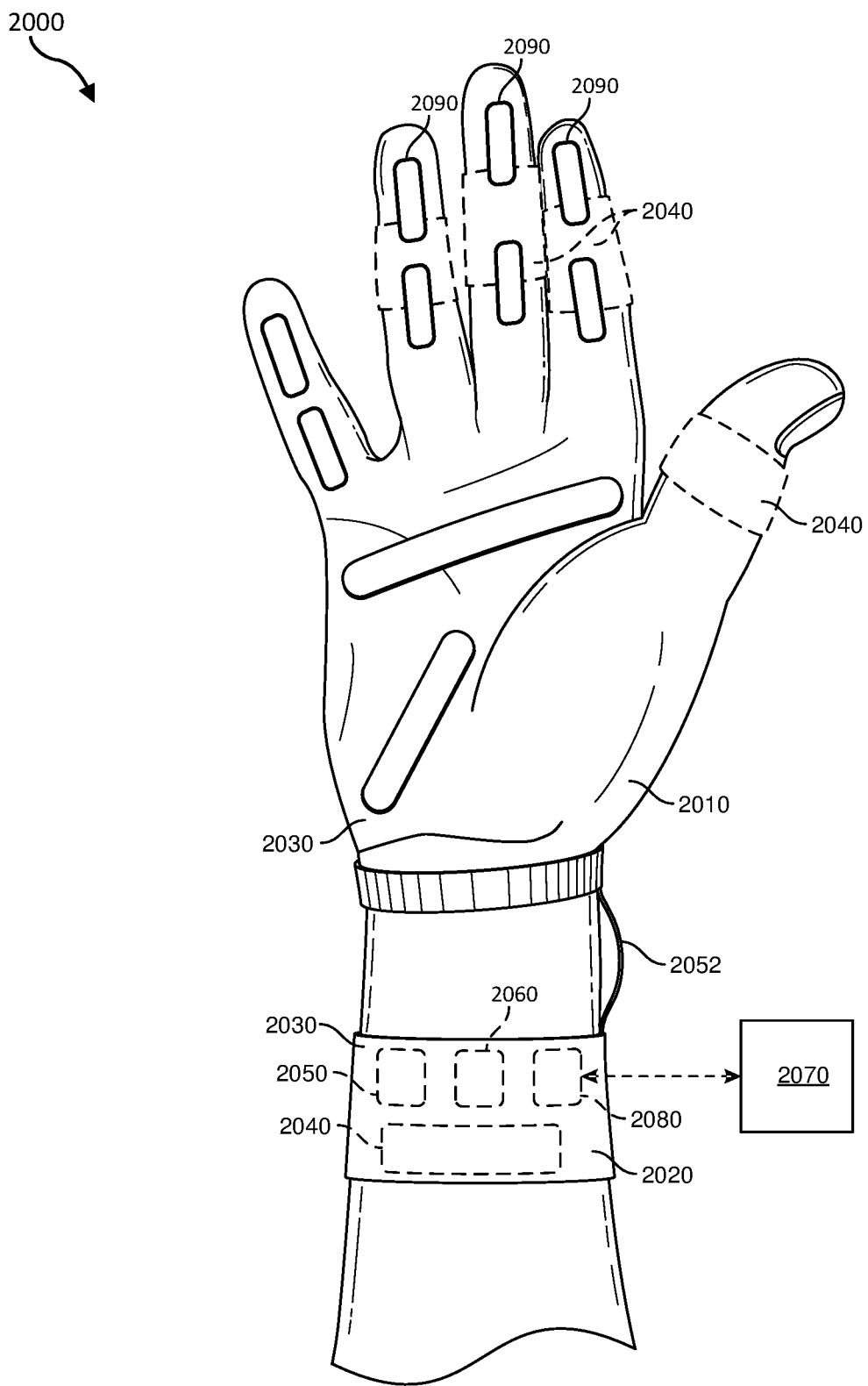
FIG. 20 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 20 illustrates a vibrotactile system 2000 in the form of a wearable glove (haptic device 2010) and wristband (haptic device 2020). Haptic device 2010 and haptic device 2020 are shown as examples of wearable devices that include a flexible, wearable textile material 2030 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 2040 may be positioned at least partially within one or more corresponding pockets formed in textile material 2030 of vibrotactile system 2000. Vibrotactile devices 2040 may be positioned in locations to provide a vibrating sensation (e.g., haptic feedback) to a user of vibrotactile system 2000. For example, vibrotactile devices 2040 may be positioned against the user's finger(s), thumb, or wrist, as shown in FIG. 20. Vibrotactile devices 2040 may, in some examples, be sufficiently flexible to conform to or bend with the user's corresponding body part(s).

A power source 2050 (e.g., a battery) for applying a voltage to the vibrotactile devices 2040 for activation thereof may be electrically coupled to vibrotactile devices 2040, such as via conductive wiring 2052. In some examples, each of vibrotactile devices 2040 may be independently electrically coupled to power source 2050 for individual activation. In some embodiments, a processor 2060 may be operatively coupled to power source 2050 and configured (e.g., programmed) to control activation of vibrotactile devices 2040.

Vibrotactile system 2000 may be implemented in a variety of ways. In some examples, vibrotactile system 2000 may be a standalone system with integral subsystems and components for operation independent of other devices and systems. As another example, vibrotactile system 2000 may be configured for interaction with another device or system 2070. For example, vibrotactile system 2000 may, in some examples, include a communications interface 2080 for receiving and/or sending signals to the other device or system 2070. The other device or system 2070 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 2080 may enable communications between vibrotactile system 2000 and the other device or system 2070 via a wireless (e.g., Wi-Fi, BLUETOOTH, cellular, radio, etc.) link or a wired link. If present, communications interface 2080 may be in communication with processor 2060, such as to provide a signal to processor 2060 to activate or deactivate one or more of the vibrotactile devices 2040.

Vibrotactile system 2000 may optionally include other subsystems and components, such as touch-sensitive pads 2090, pressure sensors, motion sensors, position sensors, lighting elements, and/or user interface elements (e.g., an on/off button, a vibration control element, etc.). During use, vibrotactile devices 2040 may be configured to be activated for a variety of different reasons, such as in response to the user's interaction with user interface elements, a signal from the motion or position sensors, a signal from the touch-sensitive pads 2090, a signal from the pressure sensors, a signal from the other device or system 2070, etc.

Although power source 2050, processor 2060, and communications interface 2080 are illustrated in FIG. 20 as being positioned in haptic device 2020, the present disclosure is not so limited. For example, one or more of power source 2050, processor 2060, or communications interface 2080 may be positioned within haptic device 2010 or within another wearable textile.

Figure 21:
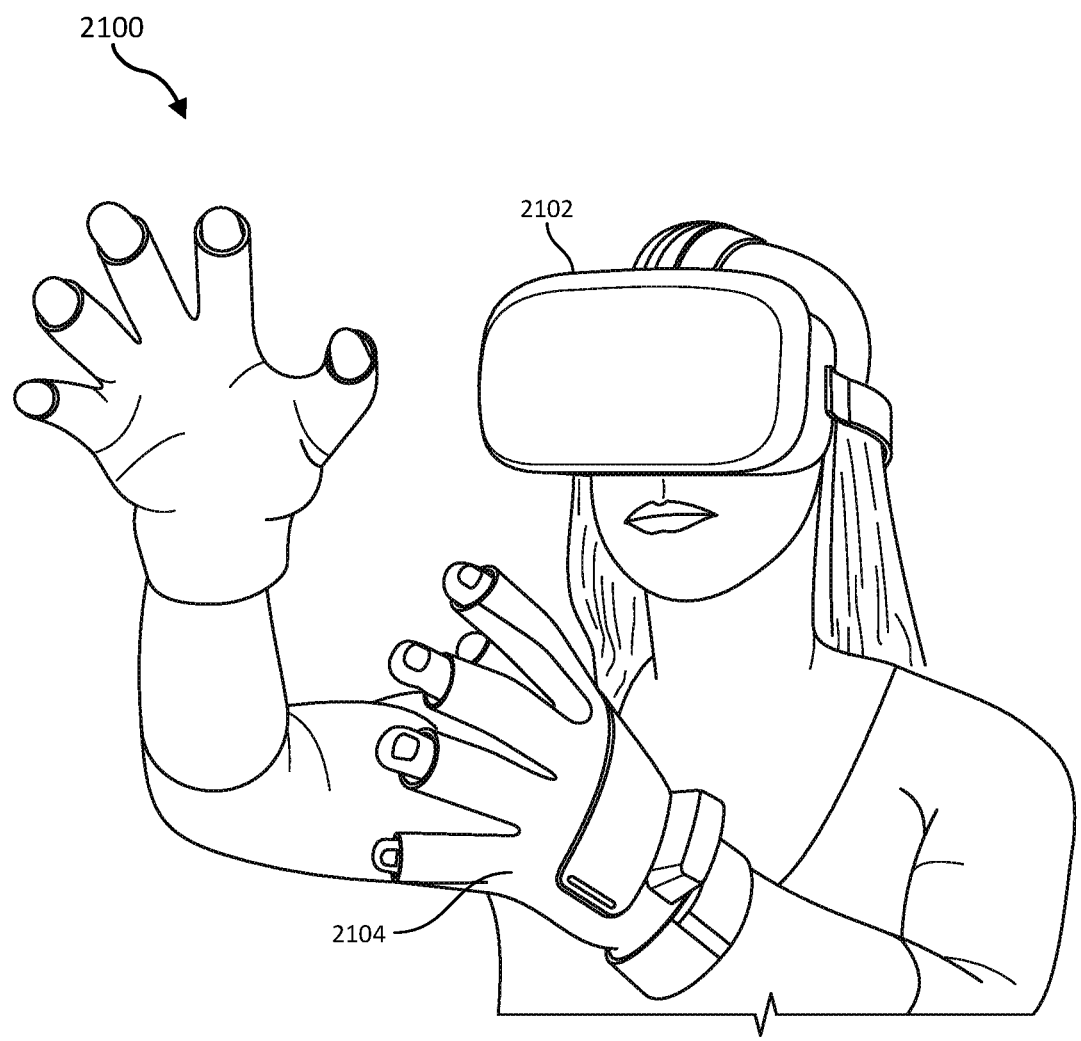
FIG. 21 is an illustration of an exemplary virtual-reality environment according to embodiments of this disclosure.

Haptic wearables, such as those shown in and described in connection with FIG. 20, may be implemented in a variety of types of artificial-reality systems and environments. FIG. 21 shows an example artificial reality environment 2100 including one head-mounted virtual-reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Figure 19:
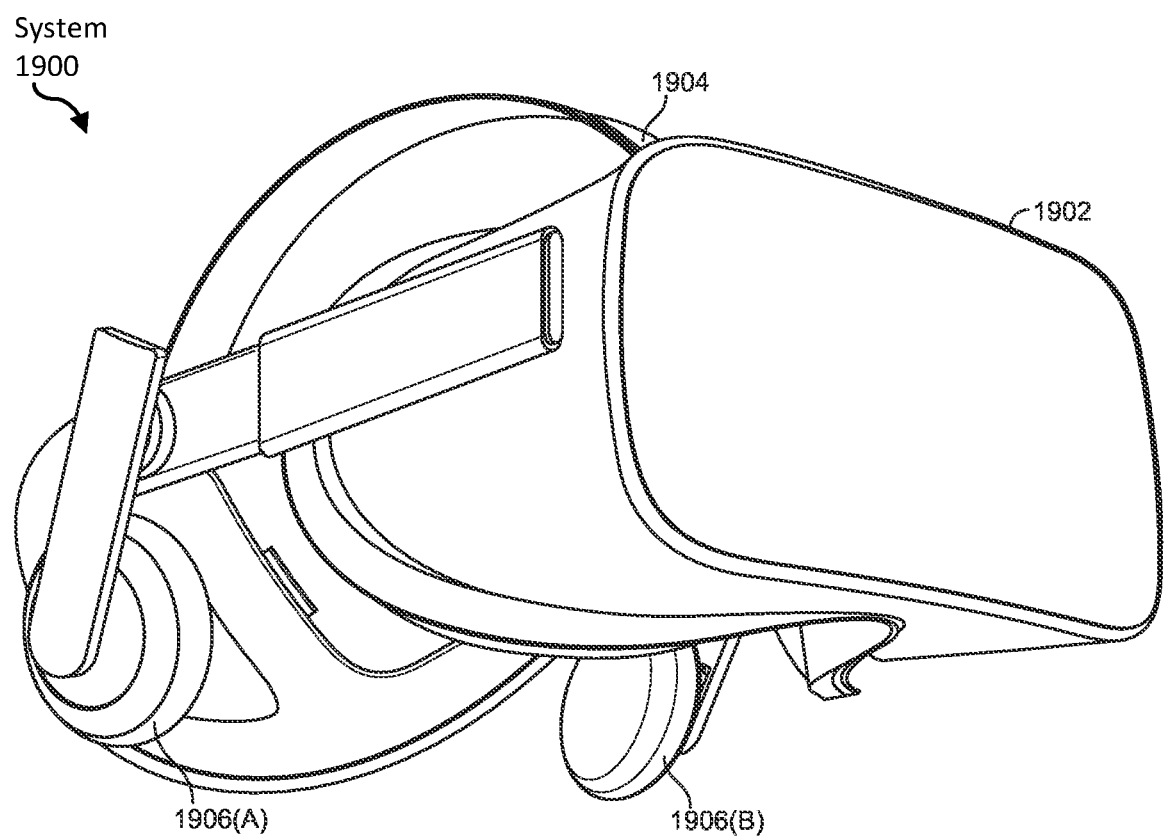
FIG. 19 is an illustration of an exemplary virtual-reality headset that may be used in connection with embodiments of this disclosure.

Head-mounted display 2102 generally represents any type or form of virtual-reality system, such as virtual-reality system 1900 in FIG. 19. Haptic device 2104 generally represents any type or form of wearable device, worn by a user of an artificial reality system, that provides haptic feedback to the user to give the user the perception that he or she is physically engaging with a virtual object. In some embodiments, haptic device 2104 may provide haptic feedback by applying vibration, motion, and/or force to the user. For example, haptic device 2104 may limit or augment a user's movement. To give a specific example, haptic device 2104 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 2104 to send action requests to a console. Examples of action requests include, without limitation, requests to start an application and/or end the application and/or requests to perform a particular action within the application.

Figure 22:
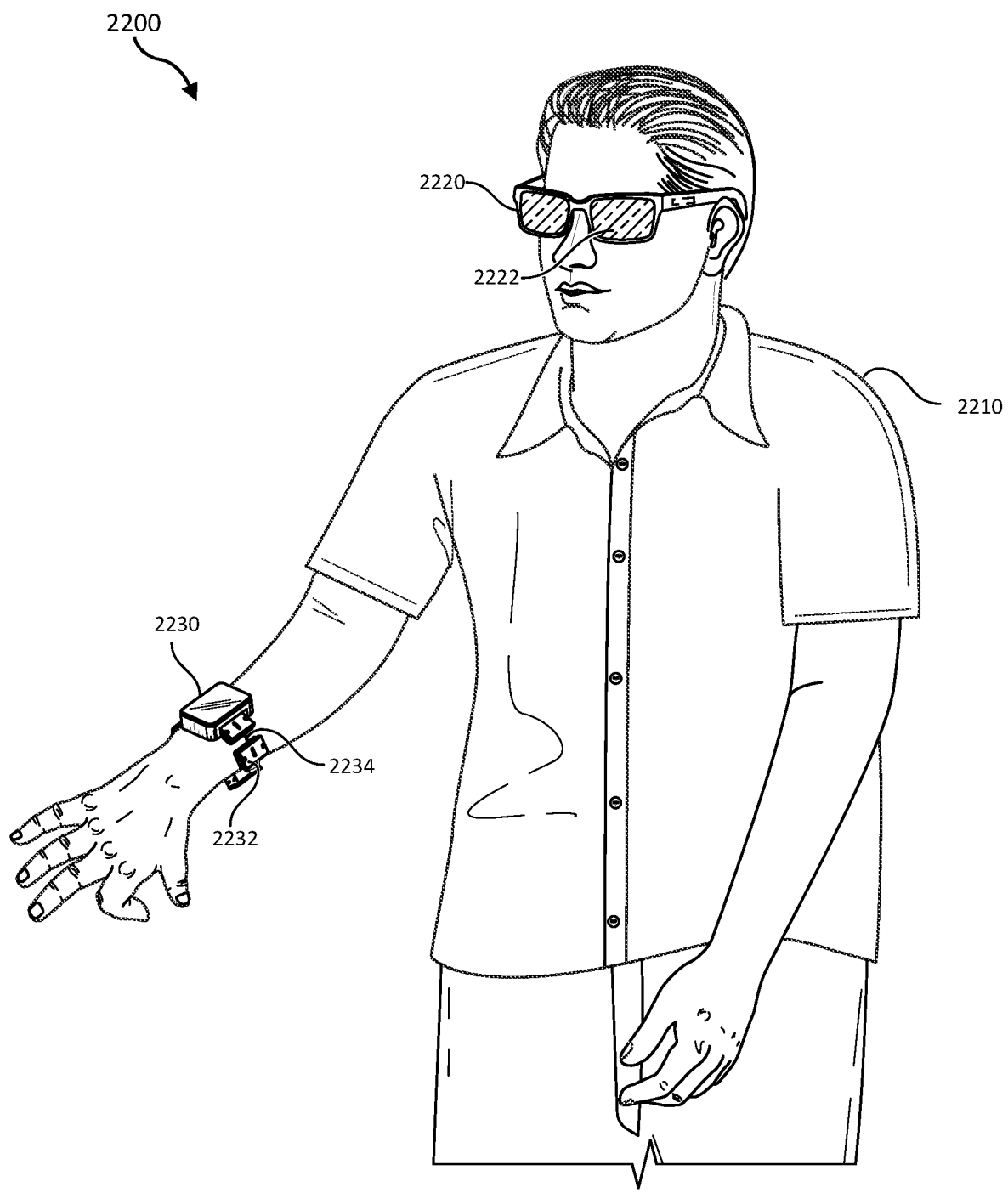
FIG. 22 is an illustration of an exemplary augmented-reality environment according to embodiments of this disclosure.

While haptic interfaces may be used with virtual-reality systems, as shown in FIG. 21, haptic interfaces may also be used with augmented-reality systems, as shown in FIG. 22. FIG. 22 is a perspective view of a user 2210 interacting with an augmented-reality system 2200. In this example, user 2210 may wear a pair of augmented-reality glasses 2220 that may have one or more displays 2222 and that are paired with a haptic device 2230. In this example, haptic device 2230 may be a wristband that includes a plurality of band elements 2232 and a tensioning mechanism 2234 that connects band elements 2232 to one another. Example devices and systems may include actuators such as those disclosed herein.

One or more of band elements 2232 may include any type or form of actuator suitable for providing haptic feedback. For example, one or more of band elements 2232 may be configured to provide one or more of various types of cutaneous feedback, including vibration, force, traction, texture, and/or temperature. To provide such feedback, band elements 2232 may include one or more of various types of actuators. In one example, each of band elements 2232 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 2010, 2020, 2104, and 2230 may include any suitable number and/or type of haptic transducer, sensor, and/or feedback mechanism. For example, haptic devices 2010, 2020, 2104, and 2230 may include one or more mechanical transducers, piezoelectric transducers, and/or fluidic transducers. Haptic devices 2010, 2020, 2104, and 2230 may also include various combinations of different types and forms of transducers that work together or independently to enhance a user's artificial-reality experience. In one example, each of band elements 2232 of haptic device 2230 may include a vibrotactor (e.g., a vibrotactile actuator) configured to vibrate in unison or independently to provide one or more of various types of haptic sensations to a user.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive data to be transformed (e.g., capacitance data, voltage data, displacement data, or the like), transform the data, output a result of the transformation to perform a function (e.g., to control the device, to modify the controller, the applied voltage, or other control parameter), use the result of the transformation to perform the function, and/or store the result of the transformation to perform the function. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference may be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device, comprising:
   a membrane;
   a first electrode supported by the membrane;
   a weakly electrically conductive layer disposed on an inner surface of the first electrode;
   a second electrode;
   a dielectric fluid located between the weakly electrically conductive layer and the second electrode;
   a sensor configured to measure a capacitance between the first electrode and the second electrode; and
   a controller configured to control, based on the capacitance measured by the sensor, an electrical potential between the first electrode and the second electrode, wherein:
     the electrical potential induces an electrical polarization in the weakly electrically conductive layer; and
     the controller is configured to adjust the electrical potential to:
       exclude at least a portion of the dielectric fluid from between the weakly electrically conductive layer and the second electrode due to an electrostatic attraction therebetween; and
       modify a resistance to a displacement of the membrane.

2. The device of claim 1, wherein the electrical potential induces a movement of the first electrode towards the second electrode.

3. The device of claim 2, further comprising an enclosure that is at least partially filled with the dielectric fluid, wherein the movement of the first electrode towards the second electrode urges the dielectric fluid from between the first electrode and the second electrode.

4. The device of claim 3, wherein the capacitance is responsive to an area of the device in which the portion of the dielectric fluid is displaced from between the first electrode and the second electrode.

5. The device of claim 1, wherein the device comprises an actuator, and the electric potential induces the displacement of at least a part of the actuator.

6. The device of claim 5, wherein the controller is configured to determine the displacement based on the capacitance.

7. The device of claim 1, wherein the device is a wearable device.

8. The device of claim 7, wherein:
   the device is a haptic device to be worn by a user; and
   the device is configured to provide a perceptible tactile sensation to the user in response to the electrical potential when the device is worn by the user.

9. The device of claim 7, wherein the device comprises a wristband or a glove.

10. The device of claim 1, wherein the weakly electrically conductive layer has a resistivity of between $10^{10}$ ohm.cm and $10^{12}$ ohm.cm.

11. The device of claim 1, wherein the electrical polarization induces the electrostatic attraction between the weakly electrically conductive layer and the second electrode or a layer thereon.

12. The device of claim 1, wherein:
    the device further comprises a second weakly electrically conductive layer disposed on the second electrode; and
    the electrical polarization induces the electrostatic attraction between the weakly electrically conductive layer and the second weakly electrically conductive layer.

13. The device of claim 1, wherein the controller is further configured to determine an external applied force exerted on the membrane based on the capacitance.

14. The device of claim 13, wherein the controller is further configured to:
    determine a preload on the device based on the external applied force; and
    modify the electrical potential based on the preload.

15. A method, comprising:
    applying an electric potential determined by a controller between a first electrode and a second electrode of a device comprising a membrane to induce a displacement of the membrane,
    wherein
    the first electrode is disposed on the membrane,
    a weakly electrically conductive layer is disposed on an inner surface of the first electrode, and
    a dielectric fluid is located between the weakly electrically conductive layer and the second electrode;
    measuring a capacitance between the first electrode and the second electrode to determine the displacement of the membrane; and
    modifying the electric potential based on the capacitance, wherein:
      the electrical potential induces an electrical polarization in the weakly electrically conductive layer; and
      the controller is configured to adjust the electrical potential to:
        exclude at least a portion of the dielectric fluid from between the weakly electrically conductive layer and the second electrode due to an electrostatic attraction therebetween; and
        modify a resistance to displacement of the membrane.

16. The method of claim 15, wherein the device is an actuator, and the actuator is configured to provide a haptic signal.

17. A method comprising:
applying an electric potential determined by a controller between electrodes comprising a first electrode and a second electrode separated by a dielectric fluid to induce an electrostatic attraction between the electrodes and formation of a zipped state in which the dielectric fluid is excluded from between the electrodes;
measuring a capacitance between the electrodes to determine an area of the zipped state; and
modifying the electric potential to adjust the area of the zipped state, wherein:
a weakly electrically conductive layer is disposed on an inner surface of the first electrode;
the first electrode is supported on a membrane;
the electrical potential induces an electrical polarization in the weakly electrically conductive layer; and
the controller is configured to adjust the electrical potential to:
exclude at least a portion of the dielectric fluid from between the weakly electrically conductive layer and the second electrode due to the electrostatic attraction; and
modify a resistance to a displacement of the membrane.

18. The method of claim 17, wherein the method comprises controlling an actuator, the actuator comprising the membrane having the displacement based on the area of the zipped state.

19. The method of claim 17, further comprising:
providing a first membrane resistance to an external force when the displacement is less than a predetermined threshold displacement; and
providing a second membrane resistance to the external force when the displacement is greater than the predetermined threshold displacement.

* * * * *